(12) United States Patent
Hashimoto

(10) Patent No.: US 7,957,442 B2
(45) Date of Patent: Jun. 7, 2011

(54) SEMICONDUCTOR OPTICAL DEVICE

(75) Inventor: Jun-ichi Hashimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 166 days.

(21) Appl. No.: 12/500,102

(22) Filed: Jul. 9, 2009

(65) Prior Publication Data
US 2010/0008392 A1    Jan. 14, 2010

(30) Foreign Application Priority Data

Jul. 11, 2008   (JP) .............................. P2008-181684

(51) Int. Cl.
*H01S 5/00* (2006.01)
(52) U.S. Cl. ............. 372/43.01; 372/45.01; 372/45.012; 372/45.013
(58) Field of Classification Search ............... 372/43.01, 372/45.01, 45.012
See application file for complete search history.

(56) References Cited

U.S. PATENT DOCUMENTS 6,731,663 B1 * 5/2004 Kasukawa et al. ......... 372/45.01
6,807,214 B2 * 10/2004 Corzine et al. ............... 372/50.1

FOREIGN PATENT DOCUMENTS

JP   2001-144371   5/2001
WO  2004/027950   4/2004

OTHER PUBLICATIONS

Horie et al., "Longitudinal-Mode Characteristics of Weakly Index-Guided . . . Phenomena", IEEE Journal of Quantum Electronics, vol. 36, No. 12, Dec. 2000, pp. 1454-1461.

* cited by examiner

*Primary Examiner* — Dung T Nguyen
(74) *Attorney, Agent, or Firm* — Smith, Gambrell & Russell, LLP

(57) ABSTRACT

An edge-emitting semiconductor optical device comprises a first cladding layer, an active layer, and a second cladding layer. The first cladding layer is provided on a semiconductor substrate. The active layer is provided on the first cladding layer. The semiconductor substrate has a higher band gap than that of the active layer. The first cladding layer includes a first light-absorbing layer and a first light-transmitting layer. The first light-absorbing layer has a lower band gap than that of the active layer, and the first light-transmitting layer has a higher band gap than that of the active layer. The second cladding layer is provided on the active layer.

17 Claims, 10 Drawing Sheets

(a)

(b)

(a)

(b)

SEMICONDUCTOR OPTICAL DEVICE

BACKGROUND OF THE INVENTION

1. Field of the Invention

The present invention relates to a semiconductor optical device.

2. Description of the Related Art

Semiconductor lasers are widely used as semiconductor light sources. For example, a semiconductor laser including an active layer such as GaInAs or GaInAsP formed on a GaAs substrate emits a laser beam having an oscillation wavelength range of 0.9 µm to 1.25 µm. In particular, a semiconductor laser having an oscillation wavelength in 0.98 µm band is used as a pumping light source for an erbium-doped optical fiber amplifier (hereinafter referred to simply as "EDFA"), which is an optical amplifier for optical communications in 1.55 µm band. Furthermore, a semiconductor laser having an oscillation wavelength in a 1.017 µm band is used as a pumping light source for a praseodymium-doped optical fiber amplifier (hereinafter referred to simply as "PDFA"), which is an optical amplifier for optical communications in 1.3 µm band.

Nonpatent Publication 1 (Horie et al., "Longitudinal-mode characteristics of weakly index-guided buried-stripe type 980-nm laser diodes with and without substrate-mode-induced phenomena", IEEE JOURNAL OF QUANTUM ELECTRONICS (2000), vol. 36, no. 12, p. 1454-1461) discloses a semiconductor laser. Patent Publication 1 (WO2004/027950) discloses a semiconductor laser. Patent Publication 2 (Japanese Unexamined Patent Application Publication No. 2001-144371) discloses a semiconductor laser.

SUMMARY OF INVENTION

FIG. 10 shows a typical example of an oscillation spectrum of a semiconductor laser having an oscillation wavelength of 0.98 µm band. Referring to FIG. 10, spectrum "G1" represents lasing characteristics of the semiconductor laser at a current of 50 mA, "G2" at 100 mA, "G3" at 150 mA, "G4" at 200 mA, "G5" at 250 mA, and "G6" at 300 mA. These oscillation spectra show periodically-intensity-modulated characteristics in which each oscillation spectrum has a number of maximum values of optical intensity at a wavelength interval of 2 nm to 3 nm.

The oscillation spectra of the semiconductor laser reveal the following specific wavelength characteristics: one or more longitudinal modes having maximum values of intensity in the central region of the gain spectrum oscillate, and they are mode-hopped to shift to the adjacent longitudinal modes of a longer wavelength as the injection current increases. The hopping of such a longitudinal mode is not desirable because it causes a significant variation in the oscillation wavelength. When, for example, spectrum "G1" is compared with "G6" in FIG. 10, the oscillation wavelength shifts by about 15 nm in the current range of 50 mA to 300 mA. In contrast, for excitation of an EDFA, the wavelength band of light that can effectively excite the EDFA ranges from 975 nm to 985 nm. In other words, the wavelength that can effectively excite the EDFA is within a narrow range of about 10 nm. Consequently, in the excitation of the EDFA, the oscillation wavelength may deviate from the effective excitation wavelength range due to the wavelength shift caused by the mode hoppings, resulting in problems such as a decrease in excitation efficiency. Besides, the mode hoppings generate mode hopping noise that may worsen a signal-to-noise intensity ratio (S/N ratio) of emitted laser light. Furthermore, the oscillation condition changes with the mode hoppings or output fluctuations between the oscillation longitudinal modes, which causes nonlinearity in light output-current characteristic (called a kink effect) of the semiconductor laser, resulting in, for example, difficulty in linear optical amplification.

As is disclosed in Nonpatent Publication 1 and Patent Publication 1, such wavelength characteristics may result from resonance coupling of a guided mode of an active layer with a GaAs substrate mode. In other words, the GaAs substrate is transparent to the light of the wavelength ranging from 0.9 µm to 1.25 µm, and the refractive index of the GaAs substrate is higher than that of GaInP or AlGaAs, which constitutes a cladding layer. Since the refractive index of the GaAs substrate is higher than the effective refractive index of the guided mode that propagates in the active layer, the GaAs substrate itself functions as the waveguide for light in the above wavelength range to generate the substrate mode. The resonance coupling of the substrate mode with the guided mode induces the periodic intensity modulation in the oscillation spectrum and the longitudinal mode hopping associated with the current changes, which are described above.

Patent Publication 2 discloses that a light-absorbing layer provided between the substrate and a lower electrode prevents the resonance coupling between the guided mode and the substrate mode of light reflected by the rear surface of a GaAs substrate. Since the light-absorbing layer does not prevent broadening of oscillation light in the GaAs substrate, the generation of the substrate mode cannot be completely avoided. Besides, in order to provide the light-absorbing layer, an alloying process should be employed to form the light-absorbing layer on the rear surface of the substrate, in addition to a process that forms semiconductor layers on the primary surface of the substrate. This complicates the production process, and precludes an improvement in productivity and a reduction in cost.

It is an object of the present invention is to provide a semiconductor optical device whose device characteristics can be improved by a reduction in substrate mode without any increase in production steps.

The semiconductor optical device of the present invention is an edge-emitting semiconductor optical device that includes a first cladding layer, an active layer, and a second cladding layer. The first cladding layer is formed on a semiconductor substrate. The active layer is formed on the first cladding layer. The second cladding layer is formed on the active layer. The semiconductor substrate has a higher band gap than that of the active layer. The first cladding layer includes a first light-absorbing layer having a lower band gap than that of the active layer and a first light-transmitting layer having a higher band gap than that of the active layer.

In the semiconductor optical device, since the first cladding layer includes the first light-absorbing layer, the first light-absorbing layer attenuates guided light. This attenuation suppresses the broadening of the guided light in the first cladding layer to reduce leakage of the light to the semiconductor substrate. Accordingly, excitation of the substrate mode is suppressed, and deterioration of characteristics of the semiconductor optical device, such as fluctuation of the emission wavelength caused by the substrate mode, can be prevented compared with the conventional structure. Since the first light-absorbing layer can be grown together with other semiconductor layers that are grown on the semiconductor substrate, an increase in production steps of the semiconductor optical device can be avoided.

The first cladding layer of the semiconductor optical device of the present invention may further include a second light-transmitting layer having a higher band gap than that of the active layer. The first light-absorbing layer is preferably disposed between the first light-transmitting layer and the second light-transmitting layer.

In the semiconductor optical device including the first light-absorbing layer between the first light-transmitting layer and the second light-transmitting layer, the first light-absorbing layer effectively attenuates guided light. Since the attenuation reduces the broadening of the guided light in the first cladding layer, leakage of the light to the semiconductor substrate can be reduced. Consequently, deterioration of characteristics of the semiconductor optical device caused by the substrate mode can be prevented.

The first cladding layer of the semiconductor optical device of the present invention may further include a second light-absorbing layer. The first light-transmitting layer or the second light-transmitting layer is preferably disposed between the first light-absorbing layer and the second light-absorbing layer.

In the semiconductor optical device, the first light-absorbing layer is combined with the second light-absorbing layer to constitute the first cladding layer. This enhances design flexibility of a light waveguide structure for elimination of the substrate mode, resulting in easy production of a suitable device structure.

The first light-transmitting layer and the second light-transmitting layer of the semiconductor optical device of the present invention preferably have different compositions from each other.

The compositions of the first light-transmitting layer and the second light-transmitting layer of the semiconductor optical device may be different from each other. This enhances design flexibility for the light waveguide structure for a reduction in substrate mode, resulting in easy production of a suitable device structure.

The first light-absorbing layer of the semiconductor optical device of the present invention is preferably composed of any one of a Group III-V compound semiconductor composed of at least gallium (Ga), aresenic (As), and nitrogen (N), a GaInAs semiconductor, and a GaInAsP semiconductor.

In the semiconductor optical device having the first light-absorbing layer composed of any one of the above semiconductor materials, the first light-absorbing layer can absorb light of the oscillation wavelength range of 0.9 µm to 1.25 µm. Accordingly, application of the first light-absorbing layer composed of the above semiconductor material to the semiconductor optical device having the oscillation wavelength range of 0.9 µm to 1.25 µm can reduce deterioration of characteristics of the semiconductor optical device caused by the substrate mode.

The first light-absorbing layer of the semiconductor optical device of the present invention may include at least first and second semiconductor layers stacked alternately. The band gap of the first semiconductor layer differs from that of the second semiconductor layer. Besides, it is preferred that the first and second semiconductor layers be stacked periodically. The first light-absorbing layer preferably has a multilayer structure that includes a number of heterojunction interfaces therein.

In the semiconductor optical device including a number of semiconductor heterojunction interfaces in the first light-absorbing layer, introduction of crystal defects from the outside of the first light-absorbing layer can be effectively suppressed. Consequently, the intrusion of the crystal defects from the semiconductor substrate to the active layer can be effectively prevented, resulting in improved reliability of the laser.

In addition, the second cladding layer of the semiconductor optical device of the present invention preferably includes a third light-absorbing layer and a third light-transmitting layer. The third light-absorbing layer has a lower band gap than that of the active layer. The third light-transmitting layer has a higher band gap than that of the active layer.

This semiconductor optical device may include the third light-absorbing layer in the second cladding layer. Hence, the guided light that is generated by the active layer and broadened to the second cladding layer is effectively absorbed in the third light-absorbing layer to suppress the broadening of the guided light in the second cladding layer, so that the guided light diminishes at a contact layer. This can effectively reduce leakage of the guided light to the contact layer. Since the generation of the guided mode caused by the leakage of the light to the contact layer can be reduced, the lasing wavelength characteristics of the semiconductor optical device can be further stabilized.

The second cladding layer of the semiconductor optical device of the present invention may further include a fourth light-transmitting layer having a higher band gap than that of the active layer. The third light-absorbing layer is preferably disposed between the third light-transmitting layer and the fourth light-transmitting layer.

In the semiconductor optical device including the third light-absorbing layer between the third light-transmitting layer and the fourth light-transmitting layer, the third light-absorbing layer can also effectively absorb the guided light that is generated by the active layer and broadened in the second cladding layer. Therefore, the broadening of the guided light in the second cladding layer is suppressed to avoid the leakage of the light to the contact layer. As a result, the guided mode caused by the leakage of the light to the contact layer can be prevented, resulting in further stabilization of the lasing wavelength characteristics of the semiconductor optical device.

The second cladding layer of the semiconductor optical device of the present invention may further include a fourth light-absorbing layer. The third light-transmitting layer or the fourth light-transmitting layer is preferably disposed between the third light-absorbing layer and the fourth light-absorbing layer.

In the second cladding layer of the semiconductor optical device, the third light-absorbing layer is combined with the fourth light-absorbing layer to constitute a part of the second cladding layer, and this combination provides flexibility in designing the light waveguide structure for a reduction in the guided mode caused by the leakage of the light to the contact layer, resulting in easy optimization of the structure.

The third light-transmitting layer and the fourth light-transmitting layer of the semiconductor optical device of the present invention preferably have different compositions.

In the semiconductor optical device, compositions of the third light-transmitting layer and fourth light-transmitting layer are different from each other, and this increase design flexibility in the light waveguide structure for a reduction in the guided mode caused by the leakage of the light to the contact layer, which makes the structural optimization easier.

The third light-absorbing layer of the semiconductor optical device of the present invention is preferably composed of any one of a GaInAs semiconductor, a GaInAsP semiconductor, and a Group III-V compound semiconductor composed of at least gallium (Ga), aresenic (As) and nitrogen (N).

Since the third light-absorbing layer of the semiconductor optical device is composed of any one of the above semiconductor materials, the third light-absorbing layer can absorb oscillation light in the oscillation wavelength range of 0.9 µm to 1.25 μm. Accordingly, application of the third light-absorbing layer to the semiconductor optical device emitting the light in the wavelength range of 0.9 μm to 1.25 μm can reduce deterioration of characteristics of the semiconductor optical device caused by the guided mode resulting from the leakage of the light to the contact layer.

The third light-absorbing layer of the semiconductor optical device of the present invention includes the first and second semiconductor layers stacked alternately. The band gap of the first semiconductor layer differs from that of the second semiconductor layer. Besides, it is preferred that the first and second semiconductor layers be stacked periodically. The third light-absorbing layer includes a multilayer film that includes a large number of heterojunction interfaces therein. The large number of semiconductor heterojunction interfaces formed in the third light-absorbing layer can effectively interrupt crystal defects coming from the outside of the third light-absorbing layer. Consequently, the intrusion of the crystal defects from the contact layer to the active layer can be effectively reduced. This can improve the reliability of the device.

The multilayer film of the semiconductor optical device of the present invention is preferably a superlattice layer composed of any one of the following combinations: GaAs and InAs; GaAs and GaN; GaInAs and GaInP; GaAsP and InAsP; GaInAs and GaInN; and GaNAs and InNAs.

Like the case of the first or third light absorbing layer of a single layer structure, the semiconductor optical device may include a first or third light-absorbing layer of a multilayer structure composed of the superlattice layer mentioned above. This preferably provides a light-absorbing layer that absorbs the light in the emission wavelength range of 0.9 μm to 1.25 μm. Consequently, application of the first light-absorbing layer or the third light-absorbing layer of the multilayer film to the semiconductor optical device of the emission wavelength range of 0.9 μm to 1.25 μm can effectively reduce the leakage of the guided light from the first cladding layer to the semiconductor substrate or the leakage of the guided light from the second cladding layer to the contact layer. This can further stabilize the emission wavelength characteristics of the semiconductor optical device.

The active layer of the semiconductor optical device of the present invention is preferably composed of any one of a GaInAs semiconductor, a GaInAsP semiconductor, and a Group III-V compound semiconductor composed of at least gallium (Ga), aresenic (As) and nitrogen (N).

In the above semiconductor optical device, the active layer composed of the above semiconductor material can have a band gap that can generate the light of the emission wavelength range of 0.9 μm to 1.25 μm. However, semiconductor optical devices including such an active layer tend to generate noticeable wavelength variations by the mode-hopping. In contrast, the semiconductor optical device of the present invention having the first light-absorbing layer in the first cladding layer can suppress the excitation of the guided mode caused by the substrate mode. This can effectively prevent deterioration of characteristics of the semiconductor optical device such as fluctuation of the lasing wavelength.

The semiconductor substrate of the semiconductor optical device according to the present invention may be a GaAs substrate. Besides, the active layer preferably has a band gap corresponding to the lasing wavelength of 0.9 μm to 1.25 μm.

In a semiconductor optical device having a lasing wavelength range of 0.9 μm to 1.25 μm, use of a GaAs semiconductor substrate tends to noticeable wavelength variations by the mode-hopping. However, the semiconductor optical device provided with the first light-absorbing layer can suppress the excitation of the guided mode caused by the excitation of the substrate mode. This can effectively avoid deterioration of characteristics of the semiconductor optical device.

ADVANTAGEOUS EFFECTS OF INVENTION

As described above, the present invention provides a semiconductor optical device which exhibits improved lasing characteristics by a reduction in a guided mode caused by a substrate mode or leakage of light to the contact layer without an increase in production steps.

DETAILED DESCRIPTION OF THE PREFERRED EMBODIMENTS

The embodiments of a semiconductor optical device according to the present invention will be described in detail with reference to the accompanying drawings. The same or similar parts are designated by the same reference symbols, wherever possible.

First Embodiment

Figure 1:
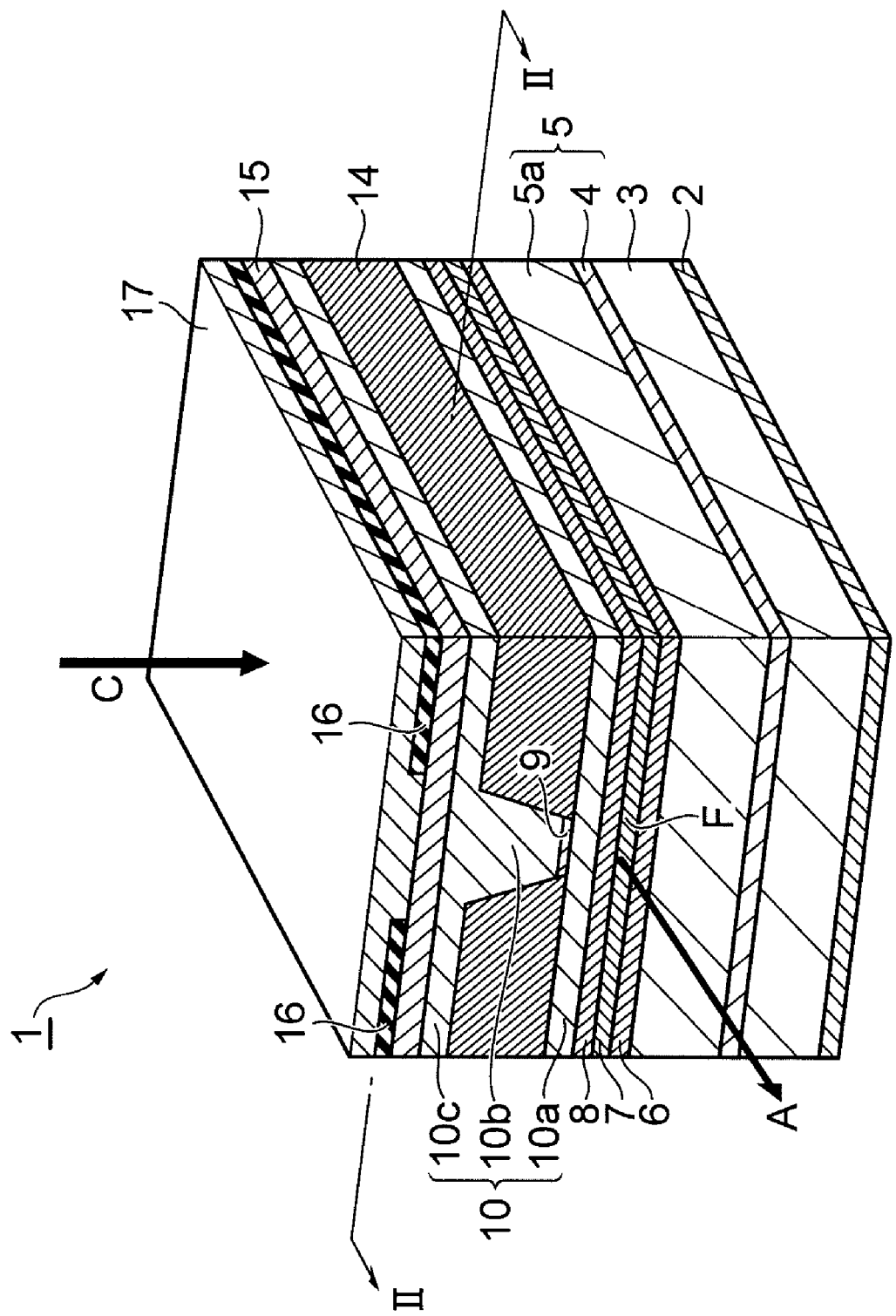
FIG. 1 is a perspective view showing a semiconductor optical device 1 of a first embodiment.
Figure 2:
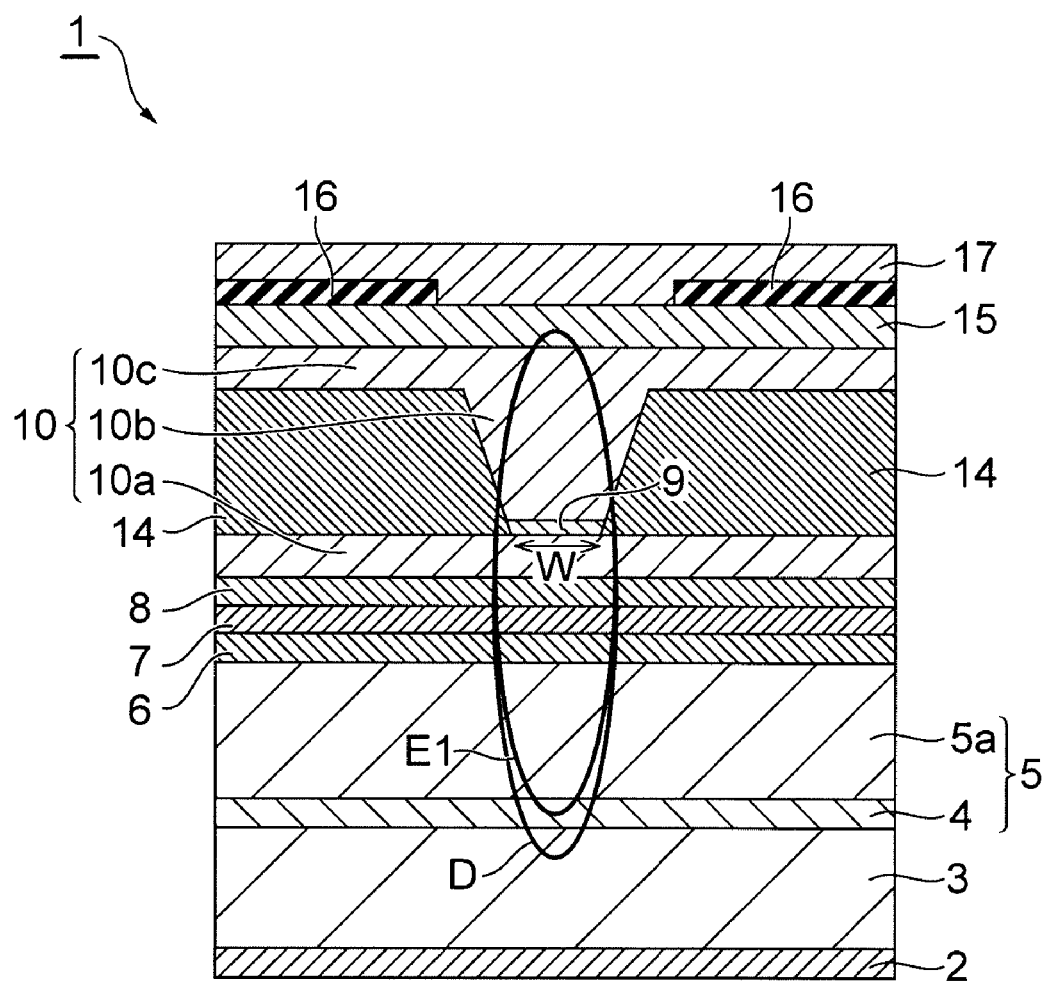
FIG. 2 is a cross-sectional view taken along the line II-II in FIG. 1.

FIG. 1 is a perspective view illustrating a semiconductor optical device 1 of the first embodiment. FIG. 2 is a cross-sectional view taken along the line II-II in FIG. 1. With reference to FIG. 1, an edge-emitting semiconductor optical device 1 such as a semiconductor laser is illustrated. The semiconductor optical device 1 of this embodiment is an "edge-emitting" semiconductor laser that emits laser light in a direction parallel to the surface of the substrate (in the direction of the arrow "A" in FIG. 1). The semiconductor optical device 1 has a predetermined emission or oscillation wavelength that is defined by the band gap of the active layer.

The semiconductor optical device 1 shown in FIGS. 1 and 2 includes an n-type electrode 2, an n-type GaAs substrate 3, an n-type lower cladding layer 5, a lower optical confinement layer 6, an active layer 7, an upper optical confinement layer 8, a p-type upper cladding layer 10, an n-type current-blocking layer 14, a p-type contact layer 15, an insulating film 16, and a p-type electrode 17.

The n-type GaAs substrate 3 is used as a semiconductor substrate of this embodiment. The n-type GaAs substrate 3, which is formed by cleaving a GaAs wafer, has a thickness that permits cleavage. The thickness of the n-type GaAs substrate 3 preferably ranges from 100 µm to 200 µm. For example, the n-type GaAs substrate has a thickness of 100 µm. Besides, the n-type GaAs substrate 3 has a higher band gap than that of the active layer 7.

The n-type lower cladding layer 5 is used as a first cladding layer of this embodiment. The n-type lower cladding layer 5 includes a lower cladding light-absorbing layer 4 and a first lower cladding light-transmitting layer 5a. The lower cladding light-absorbing layer 4 is used as a first light-absorbing layer of this embodiment. The first lower cladding light-transmitting layer 5a is used as a first light-transmitting layer of this embodiment. The lower cladding light-absorbing layer 4 is formed on the n-type GaAs substrate 3, while the first lower cladding light-transmitting layer 5a is formed on the lower cladding light-absorbing layer 4.

Figure 3:
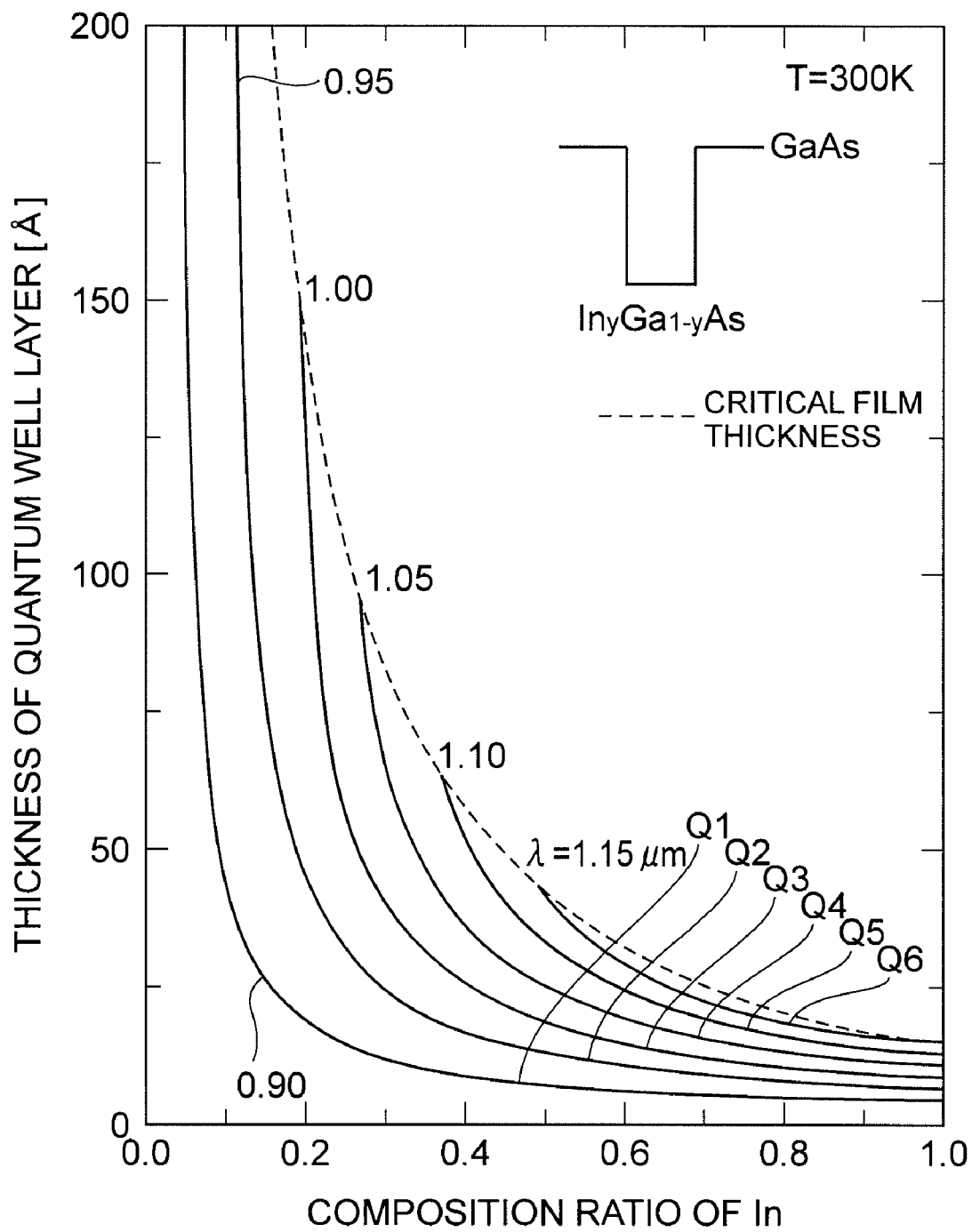
FIG. 3 is a graph showing a relationship between the composition ratio of indium and the thickness of a quantum wall layer, and the critical film thickness in an n-type GaInAs semiconductor layer.

The lower cladding light-absorbing layer 4 is used as the first light-absorbing layer of this embodiment. The lower light-absorbing layer 4 is composed of a semiconductor layer having a lower band gap than that of the active layer 7 such that the lower light-absorbing layer 4 can absorb oscillation light. With reference to FIG. 3 (quoted from Masanobu Okayasu, Tatuya Takeshita, Kou Kogure, and Shingo Uehara, The Transactions of the Institute of Electronics, Information and Communication Engineers, C-1, vol. J73-C-1, No. 7, pp. 506-511), the semiconductor optical device including an n-type GaInAs semiconductor layer formed as the lower cladding light-absorbing layer 4 is now described. The lower cladding light-absorbing layer 4 of GaInAs is a thin film strained layer with a thickness of less than or equal to the critical film thickness, and functions as a quantum well because its band gap is lower than that of the adjacent n-type GaAs substrate 3 and the first lower cladding light-transmitting layer 5a. In FIG. 3, solid lines referred to as marks "Q1" to "Q6" show the relationships between the composition ratio of indium of GaInAs quantum well layer (horizontal axis) and thickness of GaInAs quantum well layer (vertical axis) with bandgap of GaInAs quantum well layer as a parameter. (Here, the bandgap is defined as a transition wavelength (bandgap wavelength) between subband levels of the conduction band and the valence band.) The mark "Q1" represents the relationship at the band gap wavelength of 0.90 µm, "Q2" at 0.95 µm, "Q3" at 1.00 µm, "Q4" at 1.05 µm, "Q5" at 1.10 µm, and "Q6" at 1.15 µm. FIG. 3 also illustrates the dotted line indicating the critical film thickness of the GaInAs quantum well layer, which is the maximum of the thickness that does not cause deterioration in crystal quality due to incorporated crystal strain. In use of the n-type GaInAs semiconductor layer as the lower cladding light-absorbing layer 4, the composition and thickness of the GaInAs semiconductor layer are appropriately prepared such that, in FIG. 3, the band gap of the GaInAs semiconductor layer is smaller than that of the active layer 7. In other words, the composition and the thickness of the GaInAs semiconductor layer are determined such that the band gap wavelength of the GaInAs semiconductor layer is longer than the emission (oscillation) wavelength of the semiconductor optical device 1 while the thickness of the GaInAs semiconductor layer is less than or equal to the critical film thickness.

For example, an n-type GaInAs semiconductor layer having a composition ratio of indium of 0.27 has a thickness in the thickness range that provides a band gap wavelength longer than 0.98 µm, and the thickness is less than or equal to the critical film thickness of 9.3 nm. Consequently, when an emission (oscillation) wavelength of the semiconductor optical device 1 is 0.98 µm, the n-type GaInAs semiconductor layer of an indium composition ratio of 0.27 that has a thickness less than or equal to 9.3 nanometers of the critical film thickness and a thickness providing a band gap wavelength longer than 0.98 µm, can be used as a lower cladding light-absorbing layer 4. Besides, the thickness of the n-type GaInAs semiconductor layer having an indium composition ratio of 0.37 has a region in a thickness providing a band gap wavelength longer than 0.98 µm, and the thickness is less than or equal to the critical film thickness of 6.3 nm. Consequently, when an emission (oscillation) wavelength of the semiconductor optical device 1 is 0.98 µm, an n-type GaInAs semiconductor layer that has an indium composition ratio of 0.37, a thickness less than or equal to 6.3 nm of the critical film thickness, and a thickness providing a band gap wavelength longer than 0.98 µm, can be used as a lower cladding light-absorbing layer 4.

When the lower cladding light-absorbing layer 4 is formed of materials that are not lattice-matched to GaAs such as GaInAs, GaInAsP, or GaNAs, unavoidable strain is incorporated in the lower cladding light-absorbing layer 4 as in the active layer 7 composed of these materials. However, the lower cladding light-absorbing layer 4 may be sufficiently thin compared with the critical film thickness, which does not lead to the degradation of crystal quality.

The p-type upper cladding layer 10 is used as a second cladding layer of this embodiment and is formed on an active layer 7, which will be described below. The p-type upper cladding layer 10 includes a first upper cladding light-transmitting layer 10a, a second upper cladding light-transmitting layer 10b, and a third upper cladding light-transmitting layer 10c. The first upper cladding light-transmitting layer 10a is provided on the active layer 7. The second upper cladding light-transmitting layer 10b is provided on the first upper cladding light-transmitting layer 10a. The third upper cladding light-transmitting layer 10c is provided on the second upper cladding light-transmitting layer 10b. The first lower cladding light-transmitting layer 5a and the p-type upper cladding layer 10 are transparent to the light of the emission wavelength. In other word, the first lower cladding light-transmitting layer 5a and the p-type upper cladding layer 10 have bandgaps higher than that of the active layer 7, thereby avoiding the absorption of the emission light.

The first lower cladding light-transmitting layer 5a and the p-type upper cladding layer 10 are composed of, for example, GaInP, AlGaInP, AlGaAs, GaAs, or GaInAsP. These semiconductor materials, which are lattice-matched to GaAs, can be grown on the n-type GaAs substrate 3 to provide an excellent crystal growth. Besides, these semiconductor materials have high band gap energy. For example, AlGaInP that is lattice-matched to GaAs has band gap energy of 1.9 eV to 2.3 eV depending on its composition. Similarly, AlGaAs that is lattice-matched to GaAs has band gap energy of 1.42 eV to 2.16 eV. GaInAsP that is lattice-matched to GaAs has band gap energy of 1.42 eV to 1.9 eV. GaInP that is lattice-matched to GaAs has high band gap energy such as 1.9 eV. The first lower cladding light-transmitting layer 5a and the p-type upper cladding layer 10 composed of these semiconductor materials can increase differences in band gap between the above layers 5a, 10 and the active layer 7, resulting in enhancement in the carrier confinement to the active layer 7. This improves lasing and temperature characteristics of the laser.

In order to achieve effective optical confinement in the n-type lower cladding layer 5, the first lower cladding light-transmitting layer 5a preferably has a thickness in the range of 1.5 µm to 2 µm. For example, GaInP having a thickness of 1.5 µm is used as a first lower cladding light-transmitting layer 5a.

The p-type upper cladding layer 10 includes a flat first upper cladding light-transmitting layer 10a provided on the lowest of the upper cladding layer, a second upper cladding light-transmitting layer 10b which has a ridge-shape, and a flat third upper cladding light-transmitting layer 10c formed on the second upper cladding light-transmitting layer 10b. A p-type etching stop layer 9 is provided between the first upper cladding light-emitting layer 10a and the second upper cladding light-emitting layer 10b. The n-type current-blocking layer 14 is provided on the both sides of the ridge-shaped second upper cladding light-transmitting layer 10b, which is called a buried ridge structure. This ridge structure confines current to the second upper cladding light-transmitting layer 10b.

The optimum thickness of the first upper cladding light-transmitting layer 10a is in a range of, for example, 0.1 µm to 0.6 µm to suppress oscillation in higher-order horizontal transverse modes and to achieve stable oscillation only in the fundamental mode. For example, GaInP having a thickness of 0.4 µm is used as a first upper cladding light-transmitting layer 10a.

In order to obtain the planarization of the upper surface of the second upper cladding light-transmitting layer 10b (ridge portion) and n-type current-blocking layer 14, the thickness of the second upper cladding light-transmitting layer 10b is preferably the same as that of the n-type current-blocking layer 14. For example, for an n-type current-blocking layer 14 having a thickness of 0.4 µm, the second upper cladding light-transmitting layer 10b also preferably has a thickness of 0.4 µm. For example, a GaInP layer having a thickness of 0.4 µm can be used as a second upper cladding light-transmitting layer 10b.

In order to effectively confine light within the p-type upper cladding layer 10, the third upper cladding light-transmitting layer 10c preferably has a thickness of, for example, 0.7 µm to 1.2 µm. For example, a GaInP layer having a thickness of 0.7 µm is prepared as a third upper cladding light-transmitting layer 10c. In this embodiment, as an example, the first lower cladding light-transmitting layer 5a, the first upper cladding light-transmitting layer 10a, the second upper cladding light-transmitting layer 10b, and the third upper cladding light-transmitting layer 10c are composed of semiconductor layers having the same composition, i.e., semiconductor layers having the same constituent elements with the same elemental proportion.

Since the n-type current-blocking layer 14 is doped with n-type dopant, the n-type current-blocking layer 14 and the first upper cladding light-transmitting layer 10a form a p-n junction. When the semiconductor optical device 1 of this embodiment operates in a forward bias with a high potential applied to the p-type electrode 17, a reverse bias is applied to this p-n junction, resulting in a high resistance of the p-n junction. Thus, current is hard to flow into the n-type current-blocking layer 14. This effectively confines the current applied to the semiconductor optical device 1 to the second upper cladding light-transmitting layer 10b (ridge portion).

The n-type current-blocking layer 14 is preferably composed of the same semiconductor material as that of the first lower cladding light-transmitting layer 5a and the p-type upper cladding layer 10. The material for the n-type current-blocking layer 14 is made of high band-gap materials such as GaInP, AlGaInP, AlGaAs and GaInAsP which are lattice-matched to GaAs. The band gap of the n-type current blocking layer 14 is preferably higher than that of the p-type upper cladding layer 10. In this case, a hetero-barrier is formed between the n-type current-blocking layer 14 and the p-type upper cladding layer 10 due to their band gap difference. Consequently, leakage of current into the n-type current-blocking layer 14 is reduced, resulting in enhancement in the current confinement to the second upper cladding light-transmitting layer 10b. Besides, when the band gap of the n-type current-blocking layer 14 is higher than that of the p-type upper cladding layer 10, the reflective index of the second upper cladding light-transmitting layer 10b is higher than that of the n-type current-blocking layer 14, resulting in enhancement in the optical confinement to the center of the semiconductor optical device 1 that include the second upper cladding light-transmitting layer 10b. As a result, the stimulated emission occurs effectively, leading to improvements in lasing characteristics. However, the band gap of the n-type current-blocking layer 14 may be less than or equal to that of the p-type upper cladding layer 10, and in the device having this relation in band gap, lasing oscillation can be obtained.

For example, AlGaInP is used as material of an n-type current-blocking layer 14. The n-type current-blocking layer 14 preferably has a thickness more than or equal to 0.3 µm, which provides effective current blocking, resulting in sufficient confinement of the current to the ridge portion (the second upper cladding light-transmitting layer 10b). A preferred thickness of the n-type current-blocking layer 14 in the structure is, for example, 0.4 µm.

The current-confinement width, shown in FIG. 2 as "W," by the n-type current-blocking layer 14 preferably ranges from 1 µm to 5 µm. Such a range can suppress oscillation in the higher-order horizontal transverse modes and achieve stable oscillation only in the fundamental mode. A preferred width "W" for current-confining is, for example, 3 µm.

In the ridge structure of this embodiment, the thickness of the first upper cladding light-transmitting layer 10a is a dominant factor to determine characteristics of the semiconductor optical device 1. Thus, in order to obtain uniformity and reproducibility of the laser characteristics, the thickness of the first upper cladding light-transmitting layer 10a is preferably controlled with high accuracy. Consequently, a p-type etching stop layer 9 is provided between the second upper cladding light-transmitting layer 10b and the first upper cladding light-transmitting layer 10a of this embodiment. With an etchant used for the etching of the p-type upper cladding layer 10 (for example, hydrochloric acid etchant), the p-type etching stop layer 9 has a sufficiently smaller etching rate as compared with that of the p-ytype upper cladding layer 10. In other words, the p-type etching stop layer 9 is composed of a material having a high etching selection ratio relative to that of the p-type upper cladding layer 10. For example, when a p-type upper cladding layer 10 is composed of AlGaInP or GaInP and hydrochloric acid is used as etchant for the p-type upper cladding layer 10, GaAs, AlGaAs or GaInAsP is used as a constituent material of the p-type etching stop layer 9. When a p-type upper cladding layer 10 is composed of AlGaAs, GaAs or GaInAsP and phosphoric acid is used as etchant for the p-type upper cladding layer 10, GaInP or AlGaInP is used as a constituent material of the p-type etching stop layer 9. In this embodiment, the p-type etching stop layer 9 can be used, if required. Thus, the p-type etching stop layer 9 may be omitted so far as the p-type upper cladding layer 10 is provided with high precision etching.

When the semiconductor optical device 1 includes the p-type etching stop layer 9, the thickness of the p-type etching stop layer 9 is preferably minimized within the thickness range providing an etching stop effect, thereby suppressing an increase in device resistance or thermal resistance. For example, the p-type etching stop layer 9 has a thickness in the range of 5 nm to 30 nm. GaAs having a thickness of 15 nm is preferably used as a p-type etching stop layer 9.

The active layer 7 is provided on the n-type lower cladding layer 5. The active layer 7 is composed of, for example, a single quantum well layer or multiple quantum well layers. The compositions of the active layer 7 or the thickness of the quantum well layer is adjusted so as to have a band gap that permits the emission of lasing light having the wavelength range of 0.9 μm to 1.25 μm. GaInAs and GaInAsP can be applied to materials for the active layer 7 that generates lasing light in the above emission wavelength range, but any other semiconductor materials are also usable. For example, the active layer 7 may be composed of a Group III-V semiconductor material containing at least Ga, As and N, such as GaInNAs or GaNAs. The Group III-V semiconductor material including at least Ga, As and N has a lattice constant equal to or similar to the lattice constant of GaAs. Consequently, the growth of active layer 7 on the n-type GaAs substrate 3 becomes excellent.

Use of GaInAs or GaInAsP for the active layer 7 requires a ratio of its elements having a higher lattice constant than that of GaAs to achieve an emission wavelength of 0.9 μm to 1.25 μm. While these semiconductor materials are deposited on an n-type GaAs substrate 3, compressive strain is incorporated in the active layer 7. While GaNAs of an active layer 7 is grown on the n-type GaAs substrate 3, tensile strain is incorporated in the active layer 7 because GaNAs has a smaller lattice constant than that of GaAs. An excess of these strains in the active layer 7 creates defects, such as misfit dislocation caused by the strain, in the active layer 7. Thus, the thickness of the active layer 7 has to be less than or equal to the threshold thickness that does not cause defect due to strain, i.e., the critical film thickness. Since the thickness of the quantum well layer constituting the active layer 7 is sufficiently thin compared with the critical film thickness, its high crystallinity is obtained even in a semiconductor material generating strain.

When the active layer 7 is composed of a ternary semiconductor such as GaInAs or GaNAs, the ratio of constituent elements that enables a certain laser wavelength is unique. Thus, the strain of the active layer 7 has a specific magnitude. In contrast, since a quaternary semiconductor such as GaInAsP for the active layer 7 provides a wide design flexibility in the elemental ratio of the active layer 7 to realize a desired wavelength, it also provides a wide design flexibility in the amount of strain of the active layer 7. Accordingly, the composition ratio of the active layer 7 can be selected so as to obtain an amount of strain appropriate for device characteristics according to a required application, leading to the increase in flexibility to the structural design for the active layer 7.

Since the active layer 7 composed of GaInNAs is lattice-matched to GaAs, the amount of strain of the active layer 7 can approximate zero. Thus, the active layer 7 can have any thickness without restriction due to the amount of strain. For example, a bulk semiconductor layer (or a thick film layer) can be used as an active layer 7 of the above material.

The active layer 7 composed of GaNAs or GaInNAs may further contain antimony (Sb) or/and phosphorus (P). Sb contained in the active layer 7 functions as a surfactant, which suppresses three-dimensional growth of GaNAs or GaInNAs to improve its crystallinity. When the active layer 7 contains P, this phosphorus reduces local crystal strain of GaNAs or GaInNAs to improve its crystallinity and reliability, and increases the amount of N incorporated in the crystal during crystal growth. Specific examples of the composition of the active layer 7 containing Sb or P encompass GaNAsP, GaInNAsP, GaNAsSb, GaInNAsSb, GaNAsSbP, and GaInNAsSbP. The lattice constants of these semiconductor materials can be made equal or similar to that of GaAs. Consequently, the active layer 7 composed of these semiconductor materials ensures an excellent growth thereof on the n-type GaAs substrate 3.

An example of the active layer 7 is a GaInAs single quantum well layer having a band gap corresponding to an emission wavelength of 0.98 μm. The active layer 7 with this structure, which has compressive strain, preferably has a thickness less than the critical thickness, for example, in the range of several nanometers to several tens of nanometers. For example, the active layer 7 has a thickness of 8 nm.

In the semiconductor optical device 1 having an emission (oscillation) wavelength of 0.9 μm to 1.25 μm, the lower cladding light-absorbing layer 4 is composed of a semiconductor layer that has a lower band gap than that of the active layer 7 and can absorb the light of 0.9 μm to 1.25 μm. This layer may be composed of, for example, GaInAs, GaInAsP, or a Group III-V semiconductor material including at least Ga, As, and N, such as GaInNAs, or GaNAs, which can be used in the active layer 7. The composition and thickness of this layer should be adjusted with preliminarily studies so as to have a lower band gap than that of the active layer and to be able to absorb the oscillation light.

The lower optical confinement layer 6 is provided between the n-type lower cladding layer 5 and the active layer 7. The upper optical confinement layer 8 is provided between the p-type upper cladding layer 10 and the active layer 7. Semiconductor materials for the lower optical confinement layer 6 and the upper optical confinement layer 8 are, for example, GaInP, AlGaInP, AlGaAs, GaInAsP, or GaAs, which are lattice-matched to GaAs and are the same materials as those for the first lower cladding light-transmitting layer 5a and the p-type upper cladding layer 10. The lower optical confinement layer 6 may be preferably composed of a material having a band gap between that of the first lower cladding light-transmitting layer 5a and that of the active layer 7. The upper optical confinement layer 8 may be preferably composed of a material having a band gap between that of the p-type upper cladding layer 10 and that of the active layer 7. Thus, carriers from the p-type upper cladding layer 10 and the n-type lower cladding layer 5 are effectively injected into the active layer 7 without blocking by hetero-barriers formed in the following: between the p-type upper cladding layer 10 and the optical confinement layer 8; between the n-type lower cladding layer 5 and the optical confinement layer 6; between the active layer 7 and the optical confinement layer 6; and between the active layer 7 and the optical confinement layer 8.

When the lower optical confinement layer 6 and the upper optical confinement layer 8 include semiconductor layers composed of materials satisfying the above conditions of band gap, the refractive index of the active layer 7 is maximum in the semiconductor layers of from the lower cladding layer 5 to the upper cladding layer 10 except for the lower cladding light-absorbing layer 4. The refractive index of each layer monotonously decreases in the following order as apart from the active layer 7: the optical confinement layer 6; the optical confinement layer 8; the p-type upper cladding layer 10; and the n-type lower cladding layer 5. This structure enables the first lower cladding light-transmitting layer 5a and the p-type upper cladding layer 10 to confine light generated in the active layer 7 into the active layer 7, the lower optical confinement layer 6, and the upper optical confinement layer 8, resulting in enhanced optical confinement into the active layer 7.

The elemental ratio of GaInAsP in the lower optical confinement layer 6 composed of GaInAsP is controlled such that its band gap value falls within the band gap range between that of the first lower cladding light-transmitting layer 5a and that of the active layer 7. In order to achieve a sufficient optical confinement in the active layer 7, the thickness of the lower optical confinement layer 6 preferably ranges from several tens of nanometers to several hundred nanometers. For example, the lower optical confinement layer 6 has a thickness of 47 nm.

The elemental ratio of GaInAsP in the upper optical confinement layer 8 composed of GaInAsP is controlled such that its band gap value falls within the band gap range between that of the p-type upper cladding layer 10 and that of the active layer 7. In order to achieve a sufficient optical confinement in the active layer 7, a thickness of the upper optical confinement layer 8 preferably ranges from several tens of nanometer to several hundred nanometers. For example, the upper optical confinement layer 8 has a thickness of 47 nm.

The upper optical confinement layer 8 and the lower optical confinement layer 6, which are provided above and below the active layer 7 respectively, enhance the optical confinement to the active layer 7 without blocking the injection of carriers to the active layer 7, resulting in improved emission characteristics and temperature characteristics. In particular, such advantages are noticeable in the active layer 7 provided with a relatively thin quantum well layer. In the semiconductor optical device 1 according to this embodiment, the lower optical confinement layer 6 and the upper optical confinement layer 8 are used, if required. Thus, the lower optical confinement layer 6 and the upper optical confinement layer 8 may be omitted so far as the active layer 7 provides an optical confinement for lasing.

The p-type contact layer 15 is provided on the p-type upper cladding layer 10. The p-type contact layer 15 is provided as an ohmic contact to the p-type electrode 17. The p-type contact layer 15 is preferably composed of a low band-gap material such as GaAs that can readily form ohmic contact to the p-type electrode 17. The thickness of the p-type contact layer 15 preferably ranges from 0.1 µm to 0.5 µm. For example, the p-type contact layer 15 has a thickness of 0.2 µm. The insulating film 16 is provided on the p-type contact layer 15 to further enhance a current confinement effect to the ridge portion (the second upper cladding light-transmitting layer 10b), and has an opening at a portion above the top of the ridge portion. The insulating film 16 of this embodiment is not essential, and it may be omitted as needed. The insulating film 16 is preferably composed of a dielectric film, for example, SiN or $SiO_2$. The n-type electrode 2 and the p-type electrode 17 are provided for applying voltages. The p-type electrode 17 is provided on the p-type contact layer 15, whereas the n-type electrode 2 is provided on the n-type GaAs substrate 3.

As shown by arrow "C" in FIG. 1, when current is injected to the semiconductor optical device 1, the active layer 7 emits light which propagates therein. This light is not confined in the active layer 7 to broaden in a region from the n-type lower cladding layer 5 to the p-type upper cladding layer 10. The arrow "F" in FIG. 1 shows an output facet of a laser beam of the semiconductor optical device 1. Assuming that the lower cladding light-absorbing layer 4 is not provided as in a conventional semiconductor optical device, the guided light in the n-type lower cladding layer 5 further broadens into the n-type GaAs substrate 3, as shown by area "D" in FIG. 2, and then is distributed thereto. As a result, the substrate mode, which is described above, is excited to generate disturbance by the resonance coupling of the substrate mode with the original guided mode, resulting in deterioration of characteristics such as variation of an emission or an oscillation wavelength because of mode hopping.

In the semiconductor optical device 1 of this embodiment, in contrast, the lower cladding light-absorbing layer 4 is provided on the n-type GaAs substrate 3. As shown by area "E1" in FIG. 2, even if guided light reaches the bottom of the n-type lower cladding layer 5, the guided light is absorbed in the lower cladding light-absorbing layer 4. This absorption reduces leakage of the guided light to the n-type GaAs substrate 3. Accordingly, an excitation of the substrate mode is suppressed, and deterioration of the laser characteristics, such as fluctuation of the emission or oscillation wavelength caused by the excitation of substrate mode, can be prevented. In the semiconductor optical device 1 of this embodiment, the lower cladding light-absorbing layer 4 provided on the n-type GaAs substrate 3 can further reduce effects caused by the substrate mode, compared with the structure described in Patent Publication 2, resulting in improved lasing characteristics.

The lower cladding light-absorbing layer 4 of the semiconductor optical device 1 of this embodiment is provided between the n-type GaAs substrate 3 and the first lower cladding light-transmitting layer 5a. In other words, the lower cladding light-absorbing layer 4 can be epitaxially grown together with other semiconductor layers, for example, the lower cladding light-transmitting layer 5a, the semiconductor layer 7, and the p-type upper cladding layer 10. This structure can avoid an increase in production steps, compared with the structure described in Patent Publication 2.

In a conventional semiconductor optical device, the amount of guided light that leaks from the lower cladding layer to the GaAs substrate is a very small portion of the entire guided light. This very small leakage of the light activates the substrate mode. Thus, the amount of guided light that the lower cladding light-absorbing layer 4 absorbs to suppress the substrate mode may be very small. Accordingly, even if the n-type lower cladding layer 5 includes the lower cladding light-absorbing layer 4, absorption loss of the guided light is substantially the same as that of the conventional semiconductor optical device. Conversely, in order to minimize deterioration of lasing characteristics caused by the addition of the lower cladding light-absorbing layer 4, the composition, thickness and location of the lower cladding light-absorbing layer 4 in the n-type lower cladding layer 5 are preferably adjusted such that the amount of absorption of the guided light in the lower cladding light-absorbing layer 4 becomes minimum required to avoid the leakage of the light to the n-type GaAs substrate 3.

Figure 4:
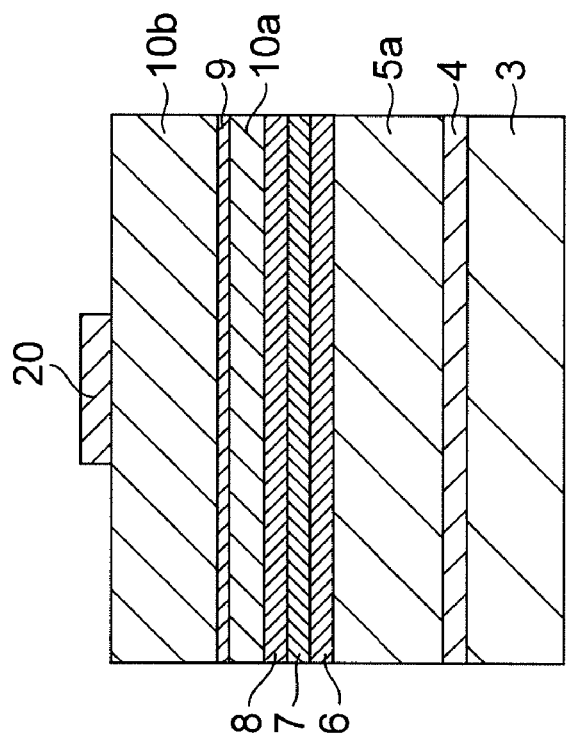
FIG. 4 is a schematic view showing primary steps of a method of fabricating a semiconductor optical device according to the first embodiment.
Figure 4:
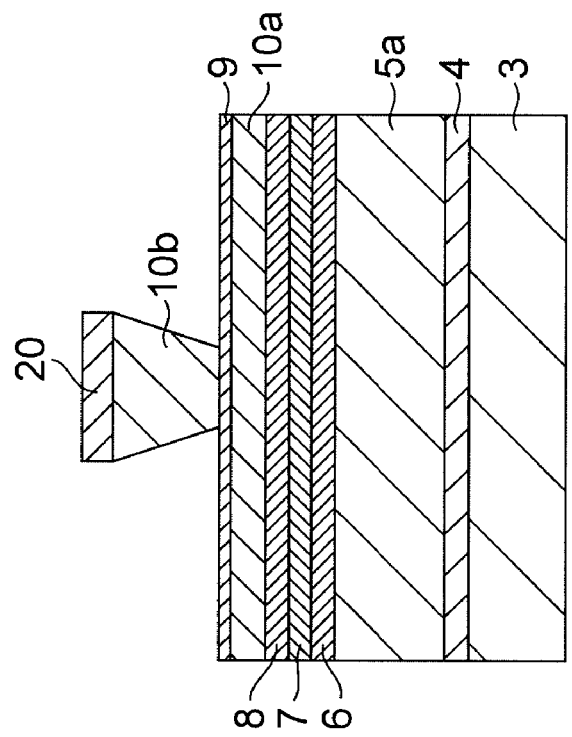

The fabricating steps of the semiconductor optical device 1 shown in FIG. 2 are explained below with reference to FIGS. 4 to 6. As shown in Part (a) of FIG. 4, a lower cladding light-absorbing layer 4, a first lower cladding light-transmitting layer 5a, a lower optical confinement layer 6, an active layer 7, an upper optical confinement layer 8, a first upper cladding light-transmitting layer 10a, a p-type middle layer (etching stop layer) 9 and a second upper cladding light-transmitting layer 10b are epitaxially grown on an n-type GaAs substrate 3 in that order. General semiconductor crystal growing apparatuses, such as a molecular beam epitaxy (MBE) reactor and an organometallic vapor phase epitaxy (OMVPE) reactor, can be used to form these semiconductor layers sequentially. Then, a mask 20 is patterned on a predetermined area of the surface of the second upper cladding light-transmitting layer 10b, and then the second upper cladding light-transmitting layer 10b is etched into a ridge form through the mask 20.

A dielectric film of, for example, SiN or $SiO_2$ is used as a mask 20. A preferred method of etching the second upper cladding light-transmitting layer 10b can be a wet etching, which can use an etchant with less etching damage in its process.

When the second upper cladding light-transmitting layer 10b is composed of GaInP or AlGaInP, a combination of hydrochloric acid etchant and a p-type middle layer 9 composed of GaAs, AlGaAs or GaInAsP can significantly reduce the etching rate of the p-type middle layer 9 compared with that of the second upper cladding light-transmitting layer 10b, which enables the p-type middle layer 9 to function as an etching stop layer. Even if the etching rate of the second upper cladding light-transmitting layer 10b varies with every fabricating lot or on a wafer surface, the etching substantially stops at the time when the etching reaches the p-type etching stop layer 9 to form the structure shown in Part (b) of FIG. 4. Consequently, the first upper cladding light-transmitting layer 10a has a highly reproducible uniform thickness on the entire surface, resulting in maintaining uniformity and reproducibility of lasing characteristics. When the second upper cladding light-transmitting layer 10b is composed of GaAs, AlGaAs or GaInAsP, the p-type middle layer 9 is composed of GaInP or AlGaInP while phosphoric acid etchant can be used. Since the etching rate of the p-type middle layer 9 can be significantly reduced compared with that of the upper cladding light-transmitting layer 10b, the p-type middle layer 9 can function as an etching stop layer. Although Part (b) of FIG. 4 illustrates a reverse-mesa-shaped ridge, any other shape is also available. Different shapes thereof can be formed by modification of the etchant and/or surface orientation in the formation of the mask.

The p-type etching stop layer 9 may remain over the entire surface of the device, or may be removed except for the ridge portion by etching if needed. In this embodiment, as shown in Part (a) of FIG. 5, a part of p-type etching stop layer 9 is removed to leave the portion of the p-type etching stop layer 9 on the ridge portion. In removing the part of the p-type etching stop layer 9 by etching, the etchant is appropriately selected such that the etching stops on the underlying first upper cladding light-transmitting layer 10a, which is unlike the etching of the second upper cladding light-transmitting layer 10b. In this step, the first upper cladding light-transmitting layer 10a has a highly reproducible uniform, thickness over the entire surface because it is hardly etched. In a specific example, when the first upper cladding light-transmitting layer 10a is composed of AlGaInP or GaInP and the p-type etching stop layer 9 is composed of GaAs, AlGaAs or GaInAsP, the first upper cladding light-transmitting layer 10a can stop the etching by use of phosphoric acid etchant. In another example, when the first upper cladding light-transmitting layer 10a is composed of GaAs, AlGaAs or GaInAsP and the p-type etching stop layer 9 is composed of AlGaInP or GaInP, the first upper cladding light-transmitting layer 10a can stop the etching by use of hydrochloric acid etchant.

When the p-type etching stop layer 9 is left only in the ridge portion, lasing characteristics can be improved by adjustment of the material characteristics of the p-type etching stop layer 9. For example, the p-type etching stop layer 9 composed of a higher refractive-index material than that of an n-type current-blocking layer 14 can make the effective refractive index of the ridge portion larger than that of its both sides on which the n-type current-blocking layer 14 is provided. Thus, lasing light can be more strongly confined in the middle of the semiconductor optical device 1, resulting in further improved lasing characteristics. For example, when the p-type upper cladding layer 10 and the n-type current-blocking layer 14 are composed of GaInP, the p-type etching stop layer 9 is preferably composed of GaAs having a higher refractive index than that of GaInP.

Figure 5:
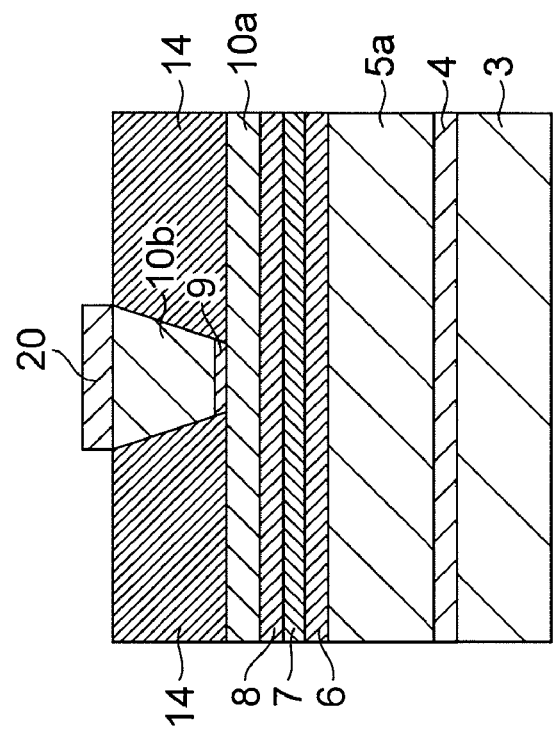
FIG. 5 is a schematic view showing primary steps of the method of fabricating the semiconductor optical device according to the first embodiment.
Figure 5:
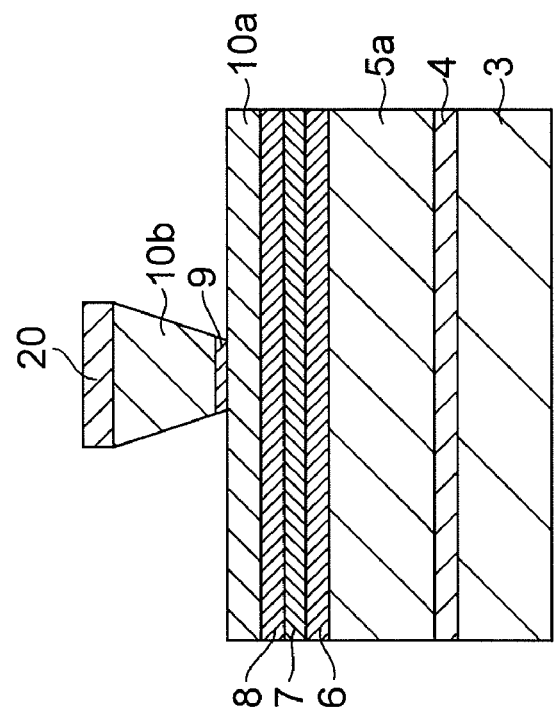

As shown in Part (b) of FIG. 5, the n-type current blocking layer 14 is grown through the remaining mask 20. Crystal growth does not occur on the mask 20 during this step, thereby forming a buried ridge structure in which the n-type current-blocking layer 14 is provided on both sides of the ridge-shaped second upper cladding light-transmitting layer 10b.

Then, the mask 20 is removed. As shown in Part (a) of FIG. 6, a third upper cladding light-transmitting layer 10c and a p-type contact layer 15 are grown, and then an insulating film 16 are grown.

Figure 6:
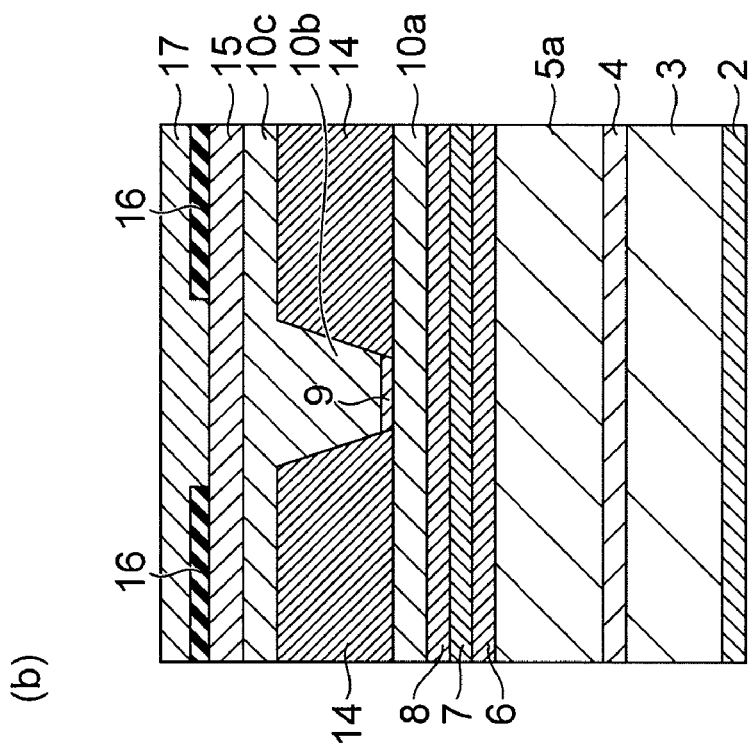
FIG. 6 is a schematic view showing primary steps of the method of fabricating the semiconductor optical device according to the first embodiment.
Figure 6:
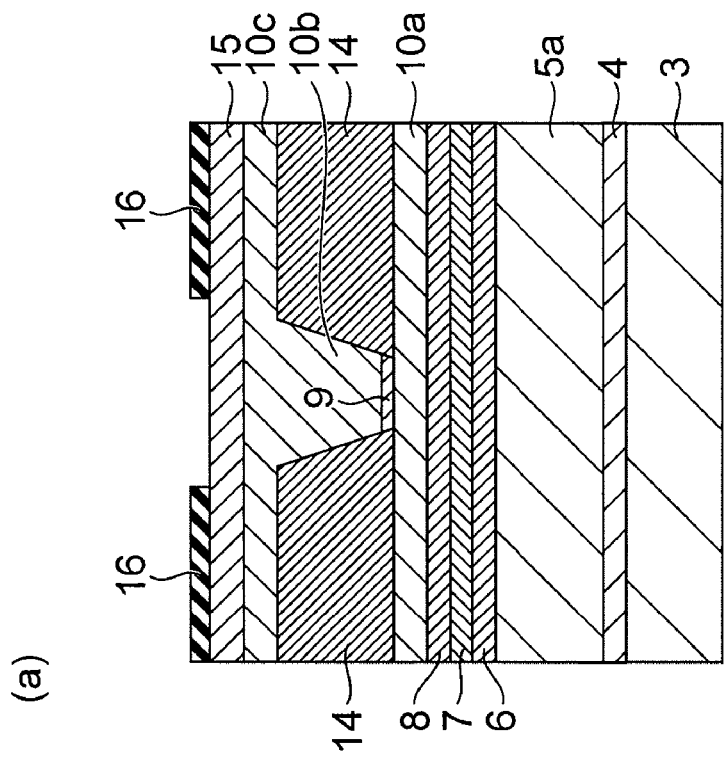

After the thickness of the n-type GaAs substrate 3 is reduced (100 μm to 200 μm, or less than or equal to 100 μm) by, for example, polishing until the polished substrate can be cleaved easily, as shown in Part (b) of FIG. 6, an n-type electrode 2 and a p-type electrode 17 are formed through a method such as vacuum evaporation or spattering to complete the semiconductor optical device 1, whereby a buried ridge type laser shown in FIG. 2 is completed. Since the lower cladding light-absorbing layer 4 of the semiconductor optical device 1 of this embodiment can be epitaxially grown at the same time together with other semiconductor layers, for example, the first lower cladding light-transmitting layer 5a, the active layer 7, and the p-type upper cladding layer 10, thereby avoiding an increase in production steps, compared with the structure described in Patent Publication 2.

The ridge structure of the semiconductor optical device 1 is not limited to the above configuration, and any structure that can confine current may be used. For example, like the semiconductor optical device 71 shown in FIG. 7, the third upper cladding light-transmitting layer 10c may be omitted from the configuration of the semiconductor optical device 1 so that the n-type current-blocking layer 14 is provided onto both side of the ridge-shaped second upper cladding light-transmitting layer 10b and the p-type contact layer 15 which are etched into a ridge shape. In this structure, a p-type upper cladding layer 70 includes the first upper cladding light-transmitting layer 10a and the second upper cladding light-transmitting layer 10b. In the formation of the semiconductor optical device 71 having such a structure, after the semiconductor layers of from the n-type lower cladding layer 5 to the p-type contact layer 15 are epitaxially grown on the n-type GaAs substrate 3 consecutively, the second upper cladding light-transmitting layer 10b and the p-type contact layer 15 may be etched to form the ridge, and then the n-type current-blocking layer 14 may be formed. The semiconductor optical device 1 shown in FIG. 1 requires three semiconductor growth steps. In contrast, the semiconductor having the above structure requires only two semiconductor growth steps, resulting in a reduction in fabricating steps. In this embodiment, the first upper cladding light-transmitting layer 10a and the second upper cladding light-transmitting layer 10b are composed of a semiconductor material containing the same constituent elements with the same elemental proportion.

Second Embodiment

Figure 8:
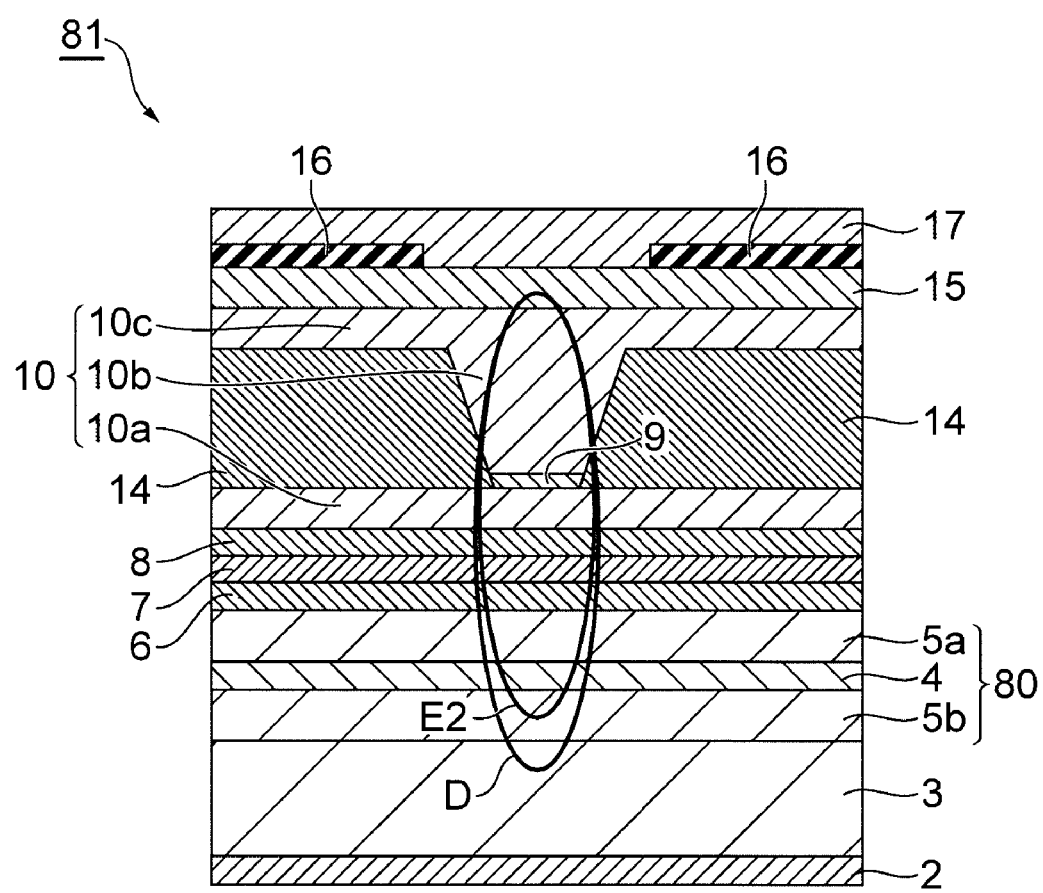
FIG. 8 is a schematic view showing a cross-section of a semiconductor optical device according to a second embodiment.

FIG. 8 is a cross-sectional view illustrating a semiconductor optical device 81 of a second embodiment. The different point between the second embodiment and the first embodiment is as follows: the position of the lower cladding light-absorbing layer 4 in the thickness direction of the n-type lower cladding layer 5 of the first embodiment differs from the position of a lower cladding light-absorbing layer 4 in the thickness direction of an n-type lower cladding layer 80 of the second embodiment.

As shown in FIG. 8, the semiconductor optical device 81 includes the n-type lower cladding layer 80 including a first lower cladding light-transmitting layer 5a, a lower cladding light-absorbing layer 4 and a second lower cladding light-transmitting layer 5b. The second lower cladding light-transmitting layer 5b is provided on an n-type GaAs substrate 3. The lower cladding light-absorbing layer 4 is provided on the second lower cladding light-transmitting layer 5b, while the first lower cladding light-transmitting layer 5a is provided on the lower cladding light-absorbing layer 4. The second lower cladding light-transmitting layer 5b functions as a second light-transmitting layer in this embodiment. The lower cladding light-absorbing layer 4 may be provided at any location in the thickness direction in the n-type lower cladding layer 80. On this occasion, the location of the lower cladding light-absorbing layer 4 is preferably adjusted such that the amount of absorption of the guided light is minimum to suppress activation of the substrate mode.

The second lower cladding light-transmitting layer 5b is transparent to the light of an oscillation wavelength. In other words, the second lower cladding light-transmitting layer 5b has a higher band gap than that of the active layer 7 such that the second lower cladding light-transmitting layer 5b does not absorb the oscillation light. The second lower cladding light-transmitting layer 5b may be composed of the same semiconductor material as that of the first lower cladding light-transmitting layer 5a shown in the first embodiment. In an example of this embodiment, the constituent elements and their elemental proportion of the semiconductor materials for the second lower cladding light-transmitting layer 5b are the same as those of the semiconductor material of the first lower cladding light-transmitting layer 5a. In another example of this embodiment, the first upper cladding light-transmitting layer 10a, the second upper cladding light-transmitting layer 10b and the third upper cladding light-transmitting layer 10c are composed of a semiconductor material containing the same constituent elements with the same elemental proportion.

Assuming that no lower cladding light-absorbing layer 4 is included as in a conventional semiconductor optical device, as shown by area "D" in FIG. 8, the guided light in the n-type lower cladding layer 80 broadens into the n-type GaAs substrate 3, and then is distributed therein. As a result, the substrate mode is activated to generate disturbance by the resonance coupling of the substrate mode with the original guided mode, resulting in deterioration of characteristics such as a variation of the oscillation wavelength by the mode hopping.

In the semiconductor optical device 81 of this embodiment, in contrast, the lower cladding light-absorbing layer 4 is provided in the n-type lower cladding layer 80. As shown by area "E2" in FIG. 8, since the guided light is absorbed in the lower cladding light-absorbing layer 4, leakage of the guided light from the n-type lower cladding layer 80 to the n-type GaAs substrate 3 diminishes. Accordingly, activation of the substrate mode is avoided to prevent deterioration of the lasing characteristics such as fluctuation of the oscillation or emission wavelength caused by the leakage. In the semiconductor optical device 81 of this embodiment, the lower cladding light-absorbing layer 4 provided in the n-type lower cladding layer 80 can further reduce effects caused by the substrate mode, compared with the structure described in Patent Publication 2, resulting in improved lasing characteristics.

The lower cladding light-absorbing layer 4 of the semiconductor optical device 81 of this embodiment is provided between the first lower cladding light-transmitting layer 5a and the second lower cladding light-transmitting layer 5b. Consequently, like the first embodiment, the lower cladding light-absorbing layer 4 can be epitaxially grown together with other semiconductor layers without increase in production steps.

In a conventional semiconductor optical device, a very small portion of the entire guided light corresponds to the amount of guided light broadening from the lower cladding layer to the GaAs substrate. This very small leakage of the light excites the substrate mode. Thus, the amount of guided light that the lower cladding light-absorbing layer 4 absorbs to suppress the substrate mode can be very small. Accordingly, even if the n-type lower cladding layer 80 includes the lower cladding light-absorbing layer 4, absorption loss of the guided light is substantially the same as that of the conventional semiconductor optical device. Conversely, in order to minimize deterioration of lasing characteristics caused by addition of the lower cladding light-absorbing layer 4, the composition and thickness of the lower cladding light-absorbing layer 4 as well as the location of the lower cladding light-absorbing layer 4 in the n-type lower cladding layer 80 are preferably adjusted such that the amount of absorption of the guided light in the lower cladding light-absorbing layer 4 is minimum required to reduce the leakage of the light to the n-type GaAs substrate 3.

Third Embodiment

Figure 9:
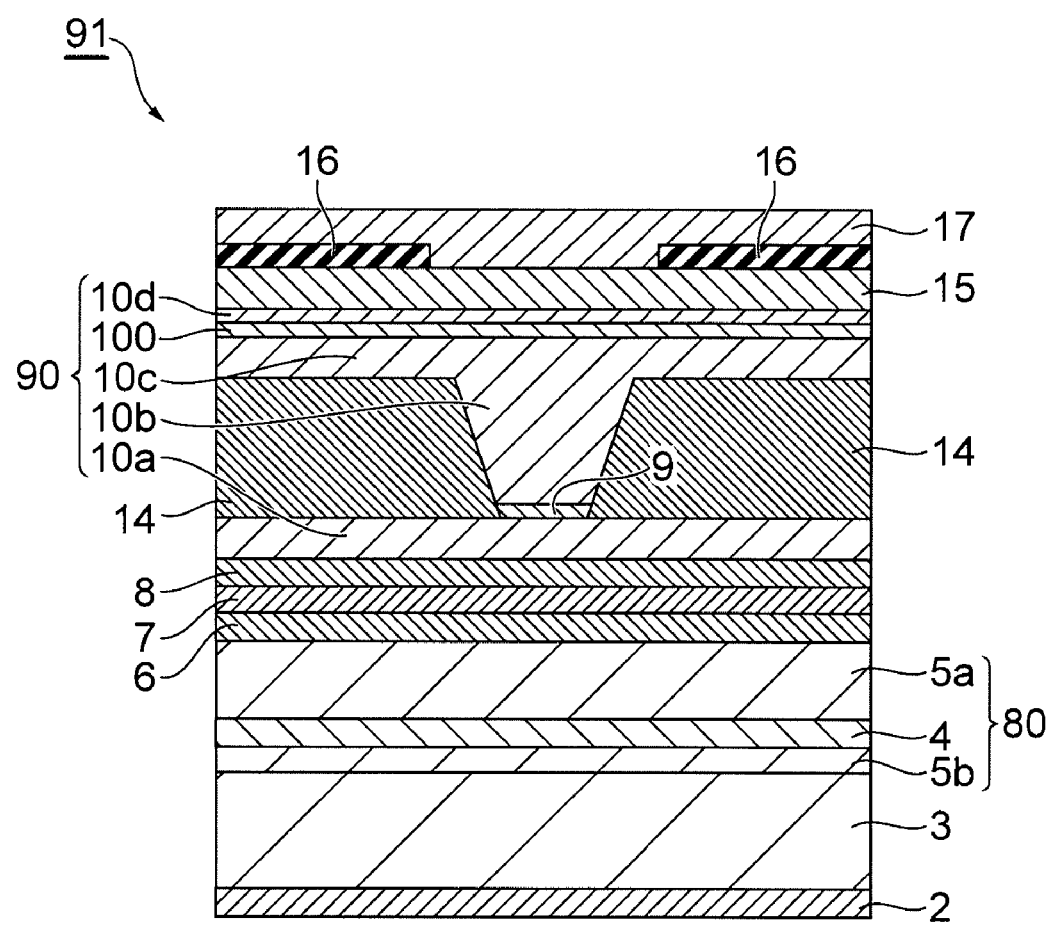
FIG. 9 is a schematic view showing a cross-section of a semiconductor optical device according to a third embodiment.
Figure 10:
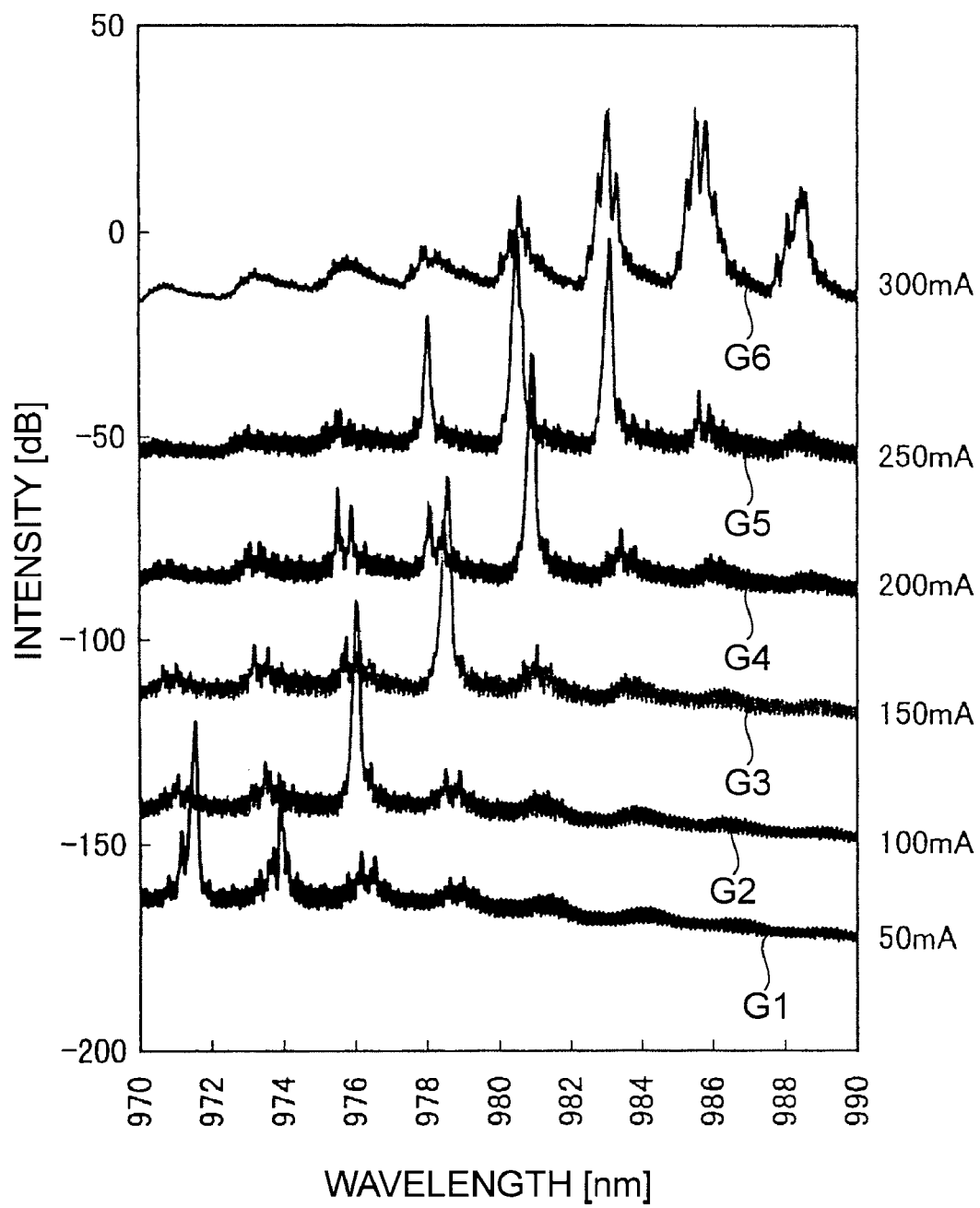
FIG. 10 is a graph showing a typical oscillation spectrum of a semiconductor laser.

FIG. 9 is a cross-sectional view illustrating a semiconductor optical device 91 of a third embodiment. In this embodiment, a semiconductor optical device will be explained below, which includes a p-type upper cladding layer 90 in place of the p-type upper cladding layer 10 of the semiconductor optical device 81 of the second embodiment.

As shown in FIG. 9, the p-type upper cladding layer 90 includes a first upper cladding light-transmitting layer 10a, a second upper cladding light-transmitting layer 10b, a third upper cladding light-transmitting layer 10c, an upper cladding light-absorbing layer 100 and a fourth upper cladding light-transmitting layer 10d. The second upper cladding light-transmitting layer 10b is provided over the first upper cladding light-transmitting layer 10a, with an etching stop layer 9 interposed therebetween. The third upper cladding light-transmitting layer 10c is provided over the second upper cladding light-transmitting layer 10b. The upper cladding light-absorbing layer 100 is provided over the third upper cladding light-transmitting layer 10c. The fourth upper cladding light-transmitting layer 10d is provided over the upper cladding light-absorbing layer 100.

The p-type upper cladding layer 90 functions as a second cladding layer in this embodiment. The first upper cladding light-transmitting layer 10a, the second upper cladding light-transmitting layer 10b, and the third upper cladding light-transmitting layer 10c function as a third light-transmitting layer in this embodiment. The fourth upper cladding light-transmitting layer 10d functions as a fourth light-transmitting layer in this embodiment. The upper cladding light-absorbing layer 100 functions as a third light-absorbing layer in this embodiment. The third light-absorbing layer is provided between the third light-transmitting layer and the fourth light-transmitting layer.

The first upper cladding light-transmitting layer 10a, the second upper cladding light-transmitting layer 10b, the third upper cladding light-transmitting layer 10c, and the fourth upper cladding light-transmitting layer 10d are transparent to the light of an oscillation wavelength. In other words, the first upper cladding light-transmitting layer 10a, the second upper cladding light-transmitting layer 10b, the third upper cladding light-transmitting layer 10c, and the fourth upper cladding light-transmitting layer 10d have a higher band gap than that of the active layer 7.

The upper cladding light-absorbing layer 100 absorbs the oscillation light that is generated by the active layer 7 and broadens into the p-type upper cladding layer 90. In other words, the upper cladding light-absorbing layer 100 has a lower band gap than that of the active layer 7.

The upper cladding light-absorbing layer 100 is composed of the same material as that of the lower cladding light-absorbing layer 4 described in the first embodiment. The first upper cladding light-transmitting layer 10a, the second upper cladding light-transmitting layer 10b, the third upper cladding light-transmitting layer 10c, and the fourth upper cladding light-transmitting layer 10d are composed of the same material as that of the first upper cladding light-transmitting layer 10a, the second upper cladding light-transmitting layer 10b and the third upper cladding light-transmitting layer 10c, respectively, which are described in the first embodiment. In an example of this embodiment, the first upper cladding light-transmitting layer 10a, the second upper cladding light-transmitting layer 10b, the third upper cladding light-transmitting layer 10c, and the fourth upper cladding light-transmitting layer 10d are composed of a semiconductor material containing the same constituent elements with the same elemental proportion.

Functions of the upper cladding light-absorbing layer 100 are described below. GaAs, which can be generally used as material for the p-type contact layer 15, has a higher refractive index than that of the p-type upper cladding layer 90. The p-type GaAs contact layer 15, as well as the n-type GaAs substrate 3, is transparent to the oscillation light in the emission wavelength range of 0.9 μm to 1.25 μm. Accordingly, the p-type GaAs contact layer 15 functions as a waveguide to the oscillation light in the emission wavelength range of 0.9 μm to 1.25 μm, like the n-type GaAs substrate 3 described in the first embodiment. When the light leaks from the p-type upper cladding layer 90 to the p-type contact layer 15, a specific mode of the p-type contact layer 15 is activated. This specific mode can couple with the original guided mode of the active layer 7. This may lead to degradation of lasing characteristics, like the substrate mode that is coupled with the guided mode.

In the semiconductor optical device 91 of this embodiment, in contrast, the upper cladding light-absorbing layer 100 provided in the p-type upper cladding layer 90 absorbs guided light that is generated by the active layer 7 and broadens to the p-type upper cladding layer 90. Thus, the broadening of the guided light in the p-type upper cladding layer 90 is reduced. As a result, the guided light is attenuated before it reaches the p-type contact layer 15, and the light does not broaden in the p-type contact layer 15. This structure can suppress excitation of another guided mode caused by leakage of the guided light to the p-type contact layer 15, resulting in avoiding deterioration of lasing characteristics.

In a conventional semiconductor optical device, the amount of guided light leaking from the p-type upper cladding layer 90 to the p-type contact layer 15 corresponds to a very small portion of the entire guided light. This very small leakage of the light activates the guided mode. Thus, the amount of guided light that the upper cladding light-absorbing layer 100 absorbs to suppress the guided mode can be very small. Accordingly, even if the p-type upper cladding layer 90 includes the upper cladding light-absorbing layer 100, absorption loss of the guided light is substantially the same as that of the conventional semiconductor optical device. Conversely, in order to minimize deterioration of lasing characteristics caused by addition of the upper cladding light-absorbing layer 100, the composition and thickness of the upper cladding light-absorbing layer 100 as well as the location of the upper cladding light-absorbing layer 100 in the p-type upper cladding layer 90 are preferably optimized such that the amount of absorption of the guided light in the upper cladding light-absorbing layer 100 becomes minimum required to avoid the leakage of the light to the p-type contact layer 15.

The upper cladding light-absorbing layer 100 can be epitaxially grown together with, for example, the p-type contact layer 15, the third upper cladding light-transmitting layer 10c, and the fourth upper cladding light-transmitting layer 10d without increase in production steps.

In the semiconductor optical device 1 having an oscillation wavelength of 0.9 μm to 1.25 μm, the upper cladding light-absorbing layer 100 is composed of a semiconductor layer that has a lower band gap than that of the active layer 7 and can absorb oscillation light in the range of 0.9 μm to 1.25 μm. This layer may be composed of, for example, GaInAs, GaInAsP, or a Group III-V semiconductor material including at least Ga, As and N, such as GaInNAs or GaNAs, which can be used for the active layer 7. The composition and the thickness of the layer can be preliminarily adjusted so as to have a lower band gap than that of the active layer and to be able to absorb the oscillation light.

In the example of this embodiment, the upper cladding light-absorbing layer 100 is provided between the third upper cladding light-transmitting layer 10c and the fourth upper cladding light-transmitting layer 10d, but the embodiment is not limited to the specific structure, such as the above structure. The upper cladding light-absorbing layer 100 may be provided at any location in the thickness direction in the p-type upper cladding layer 90.

In the example shown in FIG. 8, the first lower cladding light-transmitting layer 5a and the second lower cladding light-transmitting layer 5b in the n-type lower cladding layer 80 are composed of a semiconductor material containing the same constituent elements with the same elemental proportion. However, the present invention is not limited to this example. In other words, the first lower cladding light-transmitting layer 5a and the second lower cladding light-transmitting layer 5b in the n-type lower cladding layer 80 may be composed of a semiconductor material containing different constituent elements or having a different elemental proportion. For example, the second lower cladding light-transmitting layer 5b of the semiconductor optical device 81 shown in FIG. 8 may be composed of a material having a lower refractive index than that of the first lower cladding light-transmitting layer 5a. In this structure, the optical confinement in the n-type lower cladding layer 80 is enhanced due to the refractive index profile of the first lower cladding light-transmitting layer 5a and the second lower cladding light-transmitting layer 5b. Thus, broadening of guided light in the n-type lower cladding layer 80 can be further reduced compared with the first lower cladding light-transmitting layer 5a and the second lower cladding light-transmitting layer 5b composed of a semiconductor material containing the same constituent elements with the same elemental proportion.

In the examples of the semiconductor optical devices 1 and 81 shown in FIGS. 2 and 8, the first upper cladding light-transmitting layer 10a, the second upper cladding light-transmitting layer 10b, and the third upper cladding light-transmitting layer 10c in the p-type upper cladding layer 10 are composed of a semiconductor material containing the same constituent elements with the same elemental proportion. However, the present invention is not limited to these examples. In other words, the first upper cladding light-transmitting layer 10a, the second upper cladding light-transmitting layer 10b, and the third upper cladding light-transmitting layer 10c in the p-type upper cladding layer 10 may be composed of a semiconductor material having different constituent elements or having a different elemental proportion.

Figure 7:
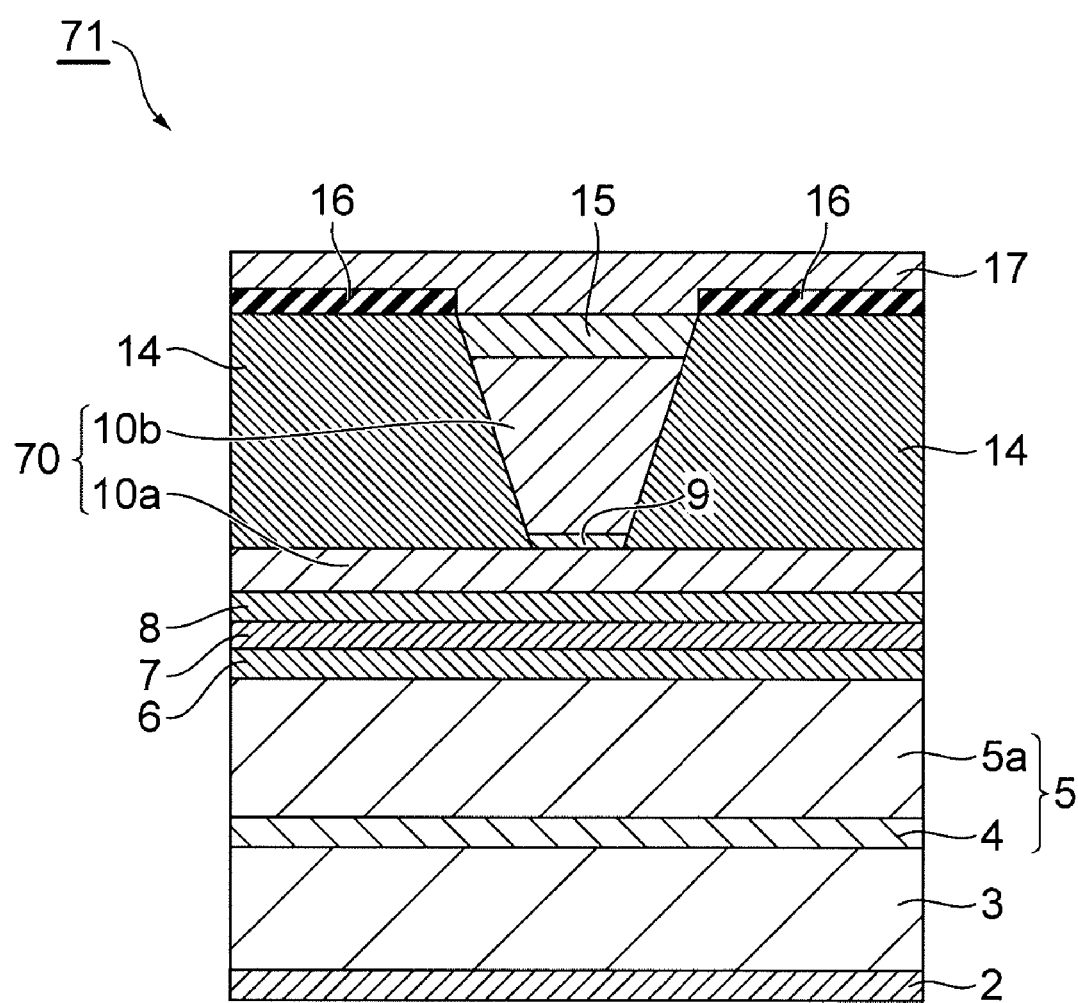
FIG. 7 is a schematic view showing a cross-section of the semiconductor optical device according to the first embodiment.

In the example of the semiconductor optical device 71 shown in FIG. 7, the first upper cladding light-transmitting layer 10a and the second upper cladding light-transmitting layer 10b in the p-type upper cladding layer 70 are composed of a semiconductor material containing the same constituent elements with the same elemental proportion. However, the present invention is not limited to this example. In other words, the first upper cladding light-transmitting layer 10a and the second upper cladding light-transmitting layer 10b in the p-type upper cladding layer 70 may be composed of a semiconductor material containing different constituent elements or having a different elemental proportion.

In the example of the semiconductor optical device 91 shown in FIG. 9, the first upper cladding light-transmitting layer 10a, the second upper cladding light-transmitting layer 10b, the third upper cladding light-transmitting layer 10c, and the fourth upper cladding light-transmitting layer 10d in the p-type upper cladding layer 90 are composed of a semiconductor material containing the same constituent elements with the same elemental proportion. However, the present invention is not limited to this example. In other words, the first upper cladding light-transmitting layer 10a, the second upper cladding light-transmitting layer 10b, the third upper cladding light-transmitting layer 10c, and the fourth upper cladding light-transmitting layer 10d in the p-type upper cladding layer 90 may be composed of a semiconductor material containing the different constituent elements or having a different elemental proportion.

When the fourth upper cladding light-transmitting layer 10d is composed of a material containing a lower refractive index than that of the first upper cladding light-transmitting layer 10a, the second upper cladding light-transmitting layer 10b, and the third upper cladding light-transmitting layer 10c, the optical confinement effect in the p-type upper cladding layer 90 is also enhanced due to the refractive index profile of the first upper cladding light-transmitting layer 10a, the second upper cladding light-transmitting layer 10b, the third upper cladding light-transmitting layer 10c, and the fourth upper cladding light-transmitting layer 10d. Thus, broadening of guided light in the p-type upper cladding layer 90 can be further reduced compared with the first upper cladding light-transmitting layer 10a, the second upper cladding light-transmitting layer 10b, the third upper cladding light-transmitting layer 10c, and the fourth upper cladding light-transmitting layer 10d that are composed of a semiconductor material containing the same constituent elements with the same elemental proportion, resulting in more readily preventing leakage of the guided light to the contact layer. As a result, excitation of another guided mode caused by the contact layer can be more effectively reduced.

Specific examples of materials that can achieve these structures are described below. For example, when the first lower cladding light-transmitting layer 5a is composed of GaInP, the second lower cladding light-transmitting layer 5b may be composed of AlGaInP having a lower refractive index than that of GaInP. When the first lower cladding light-transmitting layer 5a is composed of AlGaAs, the second lower cladding light-transmitting layer 5b may be composed of AlGaAs having a higher Al content than that of AlGaAs of the first lower cladding light-transmitting layer 5a and having a lower refractive index than that of AlGaAs of the first lower cladding light-transmitting layer 5a. In the p-type upper cladding layer 90, a structure including the fourth upper cladding light-transmitting layer 10d composed of a material having a low refractive index, and the first upper cladding light-transmitting layer 10a, the second upper cladding light-transmitting layer 10b, and the third upper cladding light-transmitting layer 10c composed of a material having a high refractive index can be achieved by the material used for the first lower cladding light-transmitting layer 5a and the second lower cladding light-transmitting sublayer 5b in the n-type lower cladding layer 5.

As is apparent from the above description, design flexibility of structures to reduce the excitation of the substrate mode and a guided mode caused by the contact layer further increases to provide more readily optimization of the structure by use of the following cases: case (a) where the first lower cladding light-transmitting layer 5a and the second lower cladding light-transmitting layer 5b in the n-type lower cladding layer 80 are composed of semiconductor materials containing different constituent elements or having a different elemental proportion; case (b) where the first upper cladding light-transmitting layer 10a, the second upper cladding light-transmitting layer 10b, and the third upper cladding light-transmitting layer 10c in the p-type upper cladding layer 10 are composed of semiconductor materials containing different constituent elements or having a different elemental proportion; case (c) where the first upper cladding light-transmitting layer 10a and the second upper cladding light-transmitting layer 10b in the p-type upper cladding layer 70 are composed of semiconductor materials containing different constituent elements or having different elemental proportions; or case (d) where the first upper cladding light-transmitting layer 10a, the second upper cladding light-transmitting layer 10b, the third upper cladding light-transmitting layer 10c, and the fourth upper cladding light-transmitting layer 10d in the p-type upper cladding layer 90 are composed of semiconductor materials containing different constituent elements or having a different elemental proportion.

The lower cladding light-absorbing layer 4 in the n-type lower cladding layers 5 and 80 or the upper cladding light-absorbing layer 100 in the p-type upper cladding layer 90, which are described in each embodiment, can be composed of a single layer film, but they may be composed of a multilayer film that can absorb the light in the emission wavelength range of 0.9 µm to 1.25 µm. For example, the lower cladding light-absorbing layer 4 or the upper cladding light-absorbing layer 100 may have a superlattice structure in which two or more semiconductor layers having different band gaps and a thickness of several nanometers are alternately and periodically stacked. In particular, a superlattice layer composed of a combination of GaAs and InAs has the same band gap as that of a monolayer film composed of GaInAs, and can absorb light in the emission wavelength range of 0.9 µm to 1.25 µm. Accordingly, the lower cladding light-absorbing layer 4 and the upper cladding light-absorbing layer 100 can contain such a superlattice layer composed of a combination of GaAs and InAs for the oscillation light in the emission wavelength range of 0.9 µm to 1.25 µm, like the monolayer film composed of GaInAs.

The superlattice layer composed of a combination of GaInAs and GaInP or of GaAsP and InAsP has the same band gap as that of the single layer film composed of GaInAsP. The superlattice layer composed of a combination of GaInAs and GaInN or of GaNAs and InNAs has the same band gap as that of the single layer film composed of GaInNAs. The superlattice layer composed of a combination of GaAs and GaN has the same band gap as that of the single layer film composed of GaNAs. The superlattice layers composed of each of these combinations can absorb light in the emission wavelength range of 0.9 μm to 1.25 μm. Accordingly, the superlattice layers composed of these combinations are used as a lower cladding light-absorbing layer 4 and an upper cladding light-absorbing layer 100 for the light in the emission wavelength range of 0.9 μm to 1.25 μm, like the layers each of which is composed of a film of a single layer.

These multilayer structures used as a lower cladding light-absorbing layer 4 or an upper cladding light-absorbing layer 100 can avoid leakage of guided light to the n-type GaAs substrate 3 and the p-type contact layer 15, thereby preventing the generation of the substrate mode and a guided mode caused by the contact layer.

In the multilayer structure, semiconductor layers having a different band gap are alternately stacked to form multiple heterojunction interfaces. The formation of the heterojunction interfaces between these disparate semiconductor layers in the lower cladding light-absorbing layer 4 or the upper cladding light-absorbing layer 100 effectively reduces the intrusion of crystal defects from the outside of the layer 4 or 100. Accordingly, the intrusion of defects from the n-type GaAs substrate 3 and the p-type contact layer 15 to the active layer 7 can be effectively reduced, resulting in improved reliability of the laser.

In each embodiment, the n-type lower cladding layer 5 or 80 or the p-type upper cladding layer 90 includes a single light-absorbing layer, but each embodiment is not limited to this structure. The n-type lower cladding layers 5 and 80 or the p-type upper cladding layer 90 can contain multiple light-absorbing layers as needed. For example, the n-type lower cladding layer 5 or 80 may further contain a light-absorbing layer (second light-absorbing layer), in addition to the lower cladding light-absorbing layer 4, and a first light-transmitting layer or a second light-transmitting layer may be disposed between the first light-absorbing layer and the second light-absorbing layer. Similarly, the p-type upper cladding layer 90 may further contain a light-absorbing layer (fourth light-absorbing layer), in addition to the upper cladding light-absorbing layer 100, and a third light-transmitting layer or a fourth light-transmitting layer may be disposed between the third light-absorbing layer and the fourth light-absorbing layer. These structures further increase design flexibility in structures of the light waveguide to reduce the occurrence of the substrate mode and a guided mode caused by the contact layer, resulting in more readily optimization of the structure. In addition, multiple light-absorbing layers having different light-absorbing characteristics for example, can be combined with each other, thereby dramatically increasing design flexibility in the structures of the light waveguide for reducing the occurrence of the substrate mode and a guided mode caused by the contact layer, resulting in considerably ready optimization of the structure.

In the semiconductor optical device of each embodiment having an emission wavelength of 0.9 μm to 1.25 μm, the second light-absorbing layer and the fourth light-absorbing layer can be composed of a semiconductor layer that has a lower band gap than that of the active layer 7 and can absorb emission light of 0.9 μm to 1.25 μm. This layer may be composed of, for example, GaInAs, GaInAsP, or a group III-V semiconductor material including at least Ga, As, and N, such as GaInNAs, or GaNAs, which can be used in the active layer 7. The composition and the thickness of the layer can be preliminarily adjusted so as to have a lower band gap than that of the active layer and to be able to absorb the oscillation light.

The second light-absorbing layer and the fourth light-absorbing layer can be composed of a monolayer film, but they may be composed of a multilayer film that can absorb oscillation light in the emission wavelength range of 0.9 μm to 1.25 μm. For example, the second light-absorbing layer and the fourth light-absorbing layer may have a superlattice structure in which two or more semiconductor layers having different band gaps and a thickness of several nanometers are alternately and periodically stacked. As a specific example of the superlattice structure, a superlattice structure, which is the same as that used for the lower cladding light-absorbing layer 4 (first light-absorbing layer) or the upper cladding light-absorbing layer 100 (third light-absorbing layer), can also be used in the second light-absorbing layer and the fourth light-absorbing layer.

In each embodiment, the semiconductor laser having the emission wavelength range of 0.9 μm to 1.25 μm is fabricated on the n-type GaAs substrate 3, but each embodiment is not limited to this structure. A semiconductor optical device may be fabricated using a p-type GaAs substrate. In this fabricating method, the conduction type of each semiconductor layer used in each embodiment should be replaced with a semiconductor layer of the opposite conduction type, that is to say, a p-type layer should be used in place of an n-type layer and an n-type layer should be used in place of a p-type layer.

In the above embodiments, the present invention is applied to semiconductor lasers. The semiconductor optical devices of the present invention are not limited to the semiconductor lasers of the embodiments described above and can include a wide range of variations and modifications. For example, the present invention can be applied to other semiconductor optical devices such as LEDs, an electroabsorption optical modulator, a Mach-Zehnder optical modulator, and a semiconductor optical amplifier (SOA). The application of the present invention to all these devices can eliminate the substrate mode, and effectively improves characteristics of the semiconductor devices. The structure of the present invention simplifies fabricating processes and reduces the fabricating steps, resulting in an improved yield and reduced cost. The composition of an active layer and other semiconductor layers is not limited to that shown in the above embodiments.

What is claimed is:

1. An edge-emitting semiconductor optical device, comprising:
   a first cladding layer provided on a semiconductor substrate,
   an active layer provided on the first cladding layer, the semiconductor substrate having a higher band gap than that of the active layer, the first cladding layer including a first light-absorbing layer and a first light-transmitting layer, the first light-absorbing layer having a lower band gap than that of the active layer, and the first light-transmitting layer having a higher band gap than that of the active layer, and
   a second cladding layer provided on the active layer.

2. The edge-emitting semiconductor optical device according to claim 1, wherein the first cladding layer includes a second light-transmitting layer having a higher band gap than that of the active layer, and the first light-absorbing layer is provided between the first light-transmitting layer and the second light-transmitting layer.

3. The edge-emitting semiconductor optical device according to claim 2, wherein the first cladding layer includes a second light-absorbing layer having a lower band gap than that of the active layer, and one of the first and second light-transmitting layers is provided between the first light-absorbing layer and the second light-absorbing layer.

4. The edge-emitting semiconductor optical device according to claim 2, wherein a semiconductor material of the first light-transmitting layer is different from that of the second light-transmitting layer.

5. The edge-emitting semiconductor optical device according to claim 1, wherein the first light-absorbing layer comprises one of GaInAs, GaInAsP, and III-V compound semiconductor containing at least Ga, As and N.

6. The edge-emitting semiconductor optical device according to claim 1, wherein the first light-absorbing layer comprises a multilayer film, the multilayer film includes plural first layers and plural second layers, and the first layers and the second layers are stacked alternately to form a periodic structure.

7. The edge-emitting semiconductor optical device according to claim 1, wherein the second cladding layer includes a third light-absorbing layer and a third light-transmitting layer, the third light-absorbing layer has a lower band gap than that of the active layer, and the third light-transmitting layer has a higher band gap than that of the active layer.

8. The edge-emitting semiconductor optical device according to claim 7, wherein the second cladding layer includes a fourth light-transmitting layer, the fourth light-transmitting layer has a higher band gap than that of the active layer, and the third light-absorbing layer is provided between the third light-transmitting layer and the fourth light-transmitting layer.

9. The edge-emitting semiconductor optical device according to claim 8, wherein the second cladding layer includes a fourth light-absorbing layer having a lower band gap than that of the active layer, and one of the third and fourth light-transmitting layers is provided between the third light-absorbing layer and the fourth light-absorbing layer.

10. The edge-emitting semiconductor optical device according to claim 8, wherein semiconductor material of the third light-transmitting layer is different from that of the fourth light-transmitting layer.

11. The edge-emitting semiconductor optical device according to claim 9, wherein semiconductor material of the third light-transmitting layer is different from that of the fourth light-transmitting layer.

12. The edge-emitting semiconductor optical device according to claim 7, wherein the third light-absorbing layer comprises one of GaInAs, GaInAsP, and III-V compound semiconductor containing at least Ga, As and N.

13. The edge-emitting semiconductor optical device according to claim 7, wherein the third light-absorbing layer comprises a multilayer film, the multilayer film includes plural third layers and plural fourth layers, and the third layers and the fourth layers are stacked alternately to constitute a periodic structure.

14. The edge-emitting semiconductor optical device according to claim 6, wherein the multilayer film comprises a super-lattice including an arrangement of one of the following combinations: a combination of GaAs and InAs; a combination of GaAs and GaN; combination of GaInAs and GaInP; a combination of GaAsP and InAsP; a combination of GaInAs and GaInN; and a combination of GaNAs and InNAs.

15. The edge-emitting semiconductor optical device according to claim 13, wherein the multilayer film comprises a super-lattice including an arrangement of one of the following combinations: a combination of GaAs and InAs; a combination of GaAs and GaN; combination of GaInAs and GaInP; a combination of GaAsP and InAsP; a combination of GaInAs and GaInN; and a combination of GaNAs and InNAs.

16. The edge-emitting semiconductor optical device according to claim 1, wherein the active layer comprises one of GaInAs, GaInAsP, and III-V compound semiconductor containing at least Ga, As and N.

17. The edge-emitting semiconductor optical device according to claim 1, wherein the semiconductor substrate comprises a GaAs substrate, and the active layer is provided to emit light having a lasing wavelength of 0.9 micrometers to 1.25 micrometers.

* * * * *